US012635450B2

(12) United States Patent (10) Patent No.: US 12,635,450 B2
Kodama et al. (45) Date of Patent: May 19, 2026

(54) SUBSTRATE PROCESSING APPARATUS, SUBSTRATE PROCESSING METHOD AND STORAGE MEDIUM

(71) Applicant: TOKYO ELECTRON LIMITED, Tokyo (JP)

(72) Inventors: Teruhiko Kodama, Kumamoto (JP); Yuzo Ohishi, Kumamoto (JP); Yoshitaka Matsuda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 723 days.

(21) Appl. No.: 18/084,063

(22) Filed: Dec. 19, 2022

(65) Prior Publication Data

US 2023/0197475 A1 Jun. 22, 2023

(30) Foreign Application Priority Data

Dec. 20, 2021 (JP) ................................. 2021-206322
Oct. 21, 2022 (JP) ................................. 2022-169343

(51) Int. Cl.
*H01L 21/67* (2006.01)
*H01L 21/677* (2006.01)
*H01L 21/687* (2006.01)
*H10P 72/00* (2026.01)
*H10P 72/30* (2026.01)
*H10P 72/76* (2026.01)

(52) U.S. Cl.
CPC ...... *H10P 72/0436* (2026.01); *H10P 72/3411* (2026.01); *H10P 72/38* (2026.01); *H10P 72/7612* (2026.01)

(58) Field of Classification Search
CPC ......... H01L 21/67115; H01L 21/67778; H01L 21/67796; H01L 21/68742; H01L 21/67028; H01L 21/67051; H01L 21/6719; H01L 21/68728; H01L 21/68764; H01L 21/68785; H01L 21/67126; H01L 21/6835; H01L 21/31058; H01L 21/68; H01L 21/6875; B32B 38/10
See application file for complete search history.

(56) References Cited

U.S. PATENT DOCUMENTS

2012/0154485 A1 6/2012 Shimizu
2014/0147990 A1* 5/2014 Hawrylchak ..... H01L 21/02252
118/723 R

FOREIGN PATENT DOCUMENTS

JP 2019-39729 A 3/2019
JP 2019-121683 A 7/2019
(Continued)

*Primary Examiner* — Robert G Bachner
(74) *Attorney, Agent, or Firm* — Nath, Goldberg & Meyer; Jerald L. Meyer; Tanya E. Harkins

(57) ABSTRACT

A substrate processing apparatus includes: a substrate holder configured to hold a substrate while being locally superimposed on a back surface of the substrate; a light irradiator configured to irradiate the back surface with light so as to remove an organic substance on the back surface of the substrate; a light shielding member provided at a back side of the substrate while being spaced apart from the back surface so as to prevent the light from being supplied to a front surface of the substrate; and a holding position changing mechanism configured to change a holding position by the substrate holder on the back surface of the substrate so as to irradiate the entire back surface of the substrate with the light.

20 Claims, 31 Drawing Sheets

(56)     References Cited

FOREIGN PATENT DOCUMENTS

KR      10-2015-0016887  A      2/2015
KR      10-2018-0088588  A      8/2018
KR      10-2019-0120708  A     10/2019

* cited by examiner

SUBSTRATE PROCESSING APPARATUS, SUBSTRATE PROCESSING METHOD AND STORAGE MEDIUM

CROSS-REFERENCE TO RELATED APPLICATIONS

This application is based upon and claims the benefit of priority from Japanese Patent Application Nos. 2022-169343 and 2021-206322, filed on Oct. 21, 2022 and Dec. 20, 2021, respectively, the entire contents of which are incorporated herein by reference.

TECHNICAL FIELD

The present disclosure relates to a substrate processing apparatus, a substrate processing method, and a non-transitory computer-readable storage medium.

BACKGROUND

In a process of manufacturing a semiconductor device, a substrate processing apparatus may irradiate the back surface of a semiconductor wafer (hereinafter referred to as wafer) with light such as ultraviolet rays. Patent Document 1 discloses that a friction reducing film is formed on the back surface of a wafer for reducing friction of the wafer with respect to an exposure stage on which the wafer is placed, and thereafter, the friction reducing film is removed by being irradiated with ultraviolet rays.

PRIOR ART DOCUMENTS

Patent Documents

Japanese Patent Laid-Open Publication No. 2019-121683

SUMMARY

According to an embodiment of the present disclosure, a substrate processing apparatus includes: a substrate holder configured to hold a substrate while being locally superimposed on a back surface of the substrate; a light irradiator configured to irradiate the back surface with light so as to remove an organic substance on the back surface of the substrate; a light shielding member provided at a back side of the substrate while being spaced apart from the back surface so as to prevent the light from being supplied to a front surface of the substrate; and a holding position changing mechanism configured to change a holding position by the substrate holder on the back surface of the substrate so as to irradiate the entire back surface of the substrate with the light.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

Figure 10:
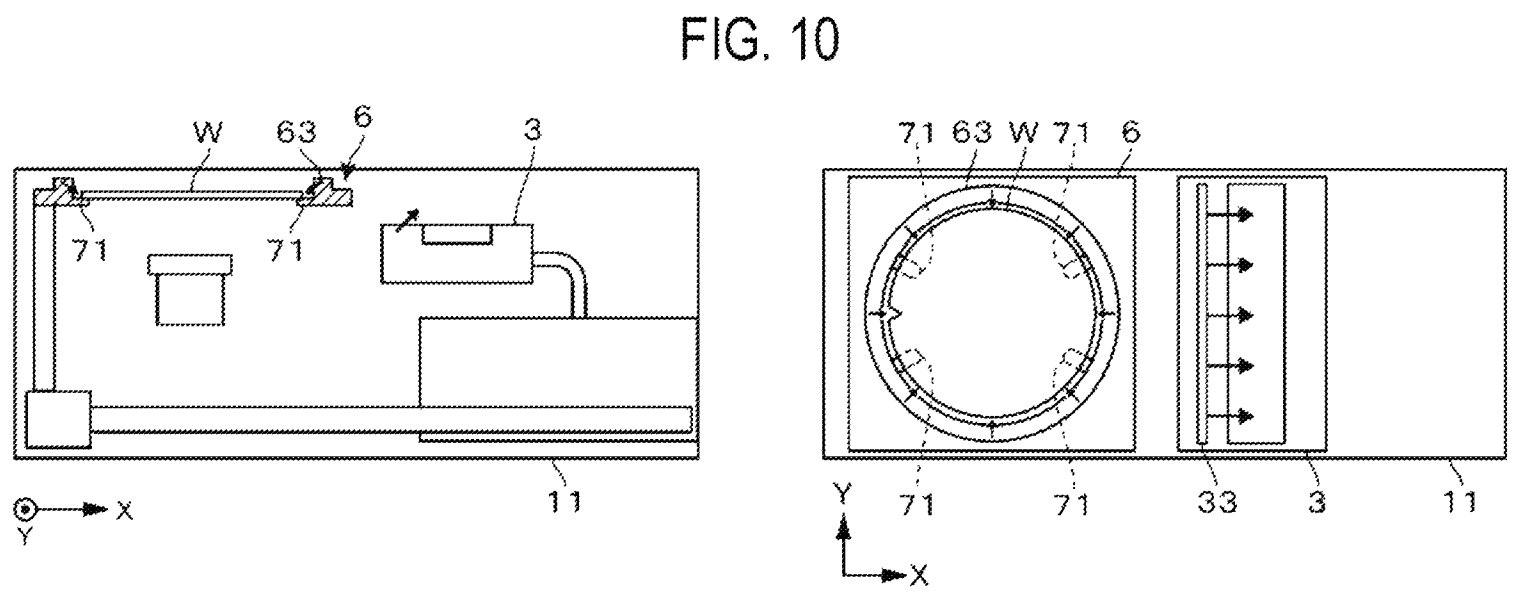

FIG. 10 is an explanatory diagram illustrating an operation of the substrate processing apparatus.

FIG. 27 is a longitudinal side view of the holding ring and the wafer.

FIG. 34 is a longitudinal rear view illustrating a modification of the second embodiment.

DETAILED DESCRIPTION

Figure 1:
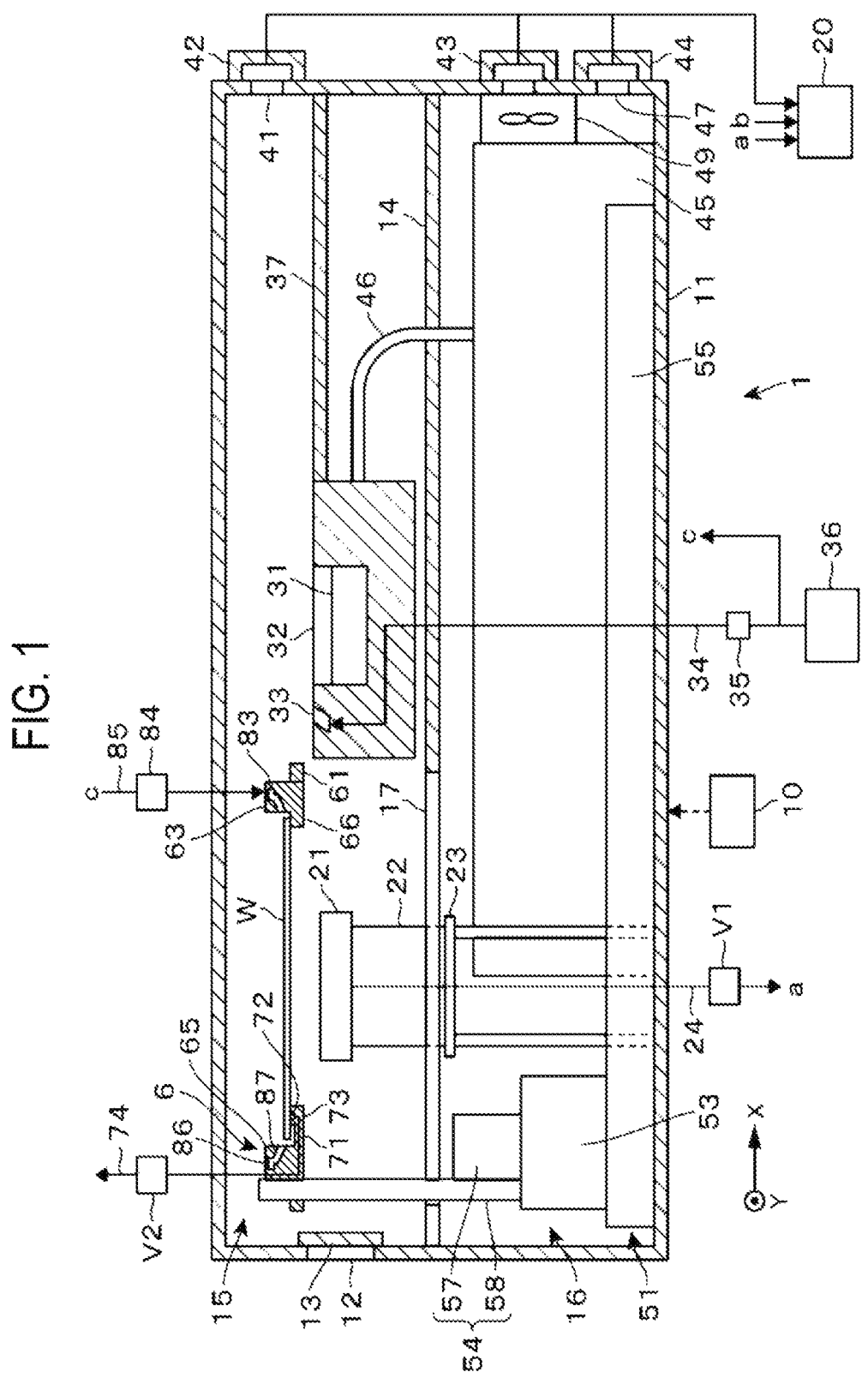
FIG. 1 is a longitudinal side view of a substrate processing apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

An outline of a substrate processing apparatus 1 according to a first embodiment of the present disclosure will be schematically described. The substrate processing apparatus 1 is provided under an atmospheric environment and a wafer W, which is a circular substrate having a resist film formed on the front surface thereof, is transferred to the substrate processing apparatus 1 by a substrate transfer mechanism 110. The resist film is completely exposed and developed, and has a predetermined pattern formed thereon. Further, an organic film M is formed on the entire back surface of the wafer W. The organic film M is made of an organic substance, for example, hexamethyldisilazane (HMDS), and was formed before exposure in order to reduce friction of the water W with respect to an exposure stage and relieve stress applied to the wafer W when the wafer W is attracted to the exposure stage for performing the exposure. The substrate processing apparatus 1 removes the organic film M by irradiating the entire back surface of the wafer W with light. The light contains ultraviolet rays (that is, vacuum ultraviolet rays) having a wavelength of 10 nm to 200 nm, and more specifically, the ultraviolet rays have a peak wavelength of, for example, 172 nm.

Further, oxygen in the atmosphere is activated by the light, thus generating $O_3$ (ozone) gas on the back side of the wafer W. The organic film M is also decomposed by a chemical action of the $O_3$ gas and removed from the wafer W, in addition to receiving light energy. In order to prevent each film formed on the front side of the wafer W from being damaged or removed, the substrate processing apparatus 1 is configured to prevent the infiltration of irradiation light and the $O_3$ gas to the front side of the wafer W.

Further, the substrate processing apparatus 1 changes a wafer holding position by a member that holds the back surface of the wafer W, in order to irradiate the entire back surface of the wafer W with light. Then, the substrate processing apparatus 1 is configured to perform light irradiation each before and after this change in position. In addition, a peripheral edge portion of the back side of the wafer W includes an inclined surface that inclines toward the front side as it approaches the circumferential end of the wafer W, and thus, the back surface of the wafer W also includes this inclined surface. Further, a peripheral edge portion of the front side of the wafer W includes an inclined surface that inclines toward the back side as it approaches the circumferential end of the wafer W. In the following description of evaluation tests and the like, these inclined surfaces will be described as a back-side inclined surface and a front inclined surface. Further, in some of the drawings to be described later, a notch which is a cut formed in the peripheral edge of the wafer W is indicated by N.

Hereinafter, a configuration of each part of the substrate processing apparatus 1 will be described in detail with reference to a longitudinal side view of FIG. 1 and a cross-sectional plan view of FIG. 2. The substrate processing apparatus 1 includes a housing 11 which is rectangular and horizontally long. A transfer port 12 for the wafer W is opened in a side surface of the housing 11 forming the short-side direction in plan view, and the wafer W is transferred through the transfer port 12 into or from the housing 11 by the transfer mechanism 110 (not illustrated in FIGS. 1 and 2). This transfer port 12 is closed by a shutter 13 which is movable up and down, except when the wafer W is loaded into or unloaded from the housing 11.

In the following description of each part within the housing 11, the side where the transfer port 12 is opened is a front side, and the opposite side is an inner side. Further, the long-side direction and the short-side direction of the housing 11 in a plan view will be referred to as the X direction and the Y direction, respectively. Thus, each of the X direction and the Y direction is the horizontal direction. Then, the transfer port 12 is open to the X direction.

Figure 3:
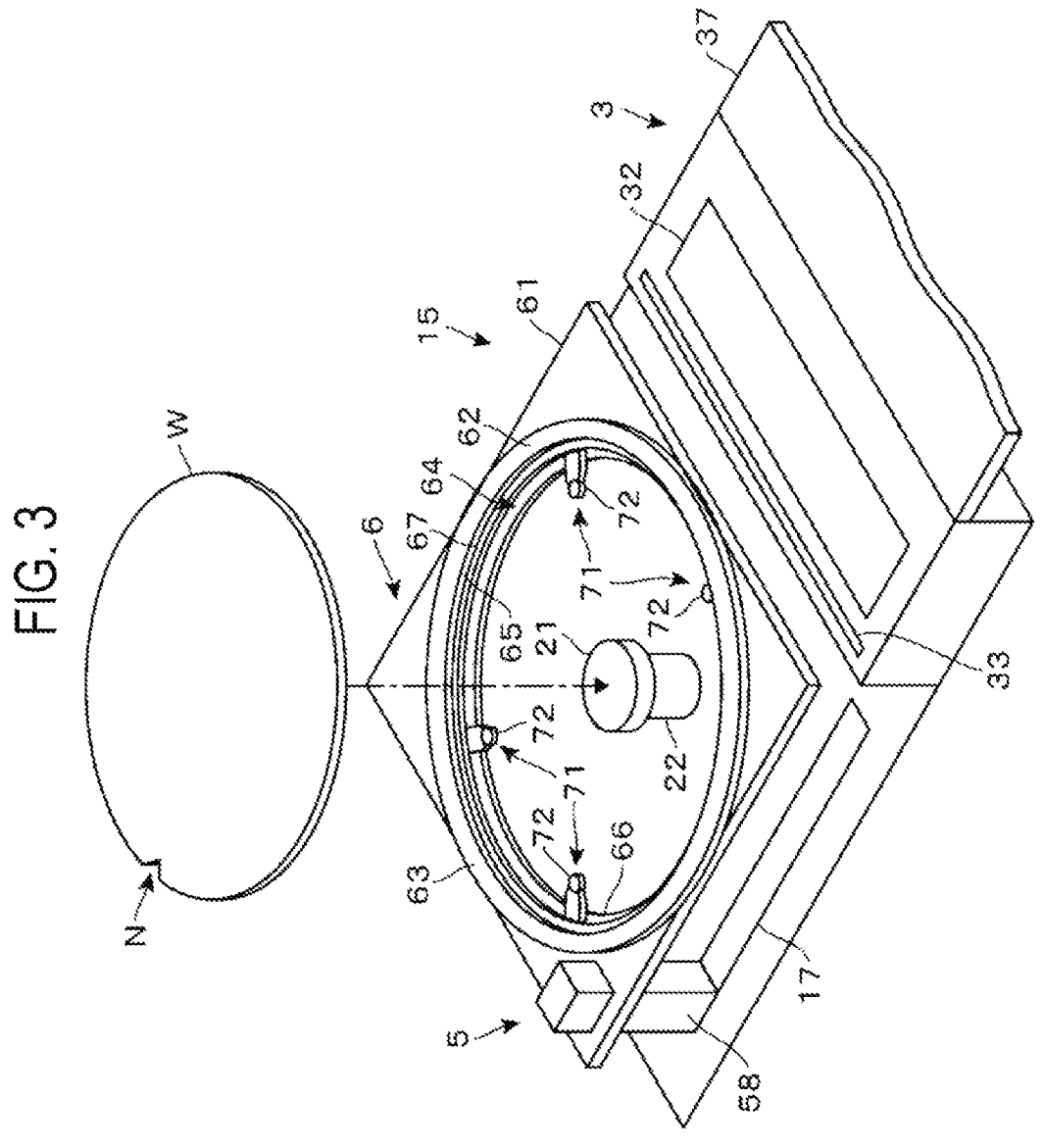
FIG. 3 is a perspective view illustrating each component on the upper side of the substrate processing apparatus.

The interior of the housing 11 is partitioned into an upper space 15 and a lower space 16 by a partition plate 14, and the transfer port 12 is open to the upper space 15. A perspective view of FIG. 3 illustrates a spin chuck 21, a light irradiation unit 3, and a wafer holding unit 5 provided in the upper space 15, and a description will also continue with appropriate reference to this FIG. 3.

The light irradiation unit 3 is a unit for emitting light upward. The wafer holding unit 5 is a unit for locally holding the back surface of the wafer W and passing the wafer W above the light irradiation unit 3 in order to irradiate the back surface of the wafer W with light. The spin chuck 21 serves to mediate the transfer of the wafer W between the transfer mechanism 110 and the wafer holding unit 5 and also to change the orientation of the wafer W so as to allow the wafer holding unit 5 to hold different positions of the back surface of the wafer W.

In a further description of the spin chuck 21, the spin chuck 21 is circular and is provided in the front side of the upper space 15. The upper surface of the spin chuck 21 is configured as a horizontal placement surface for the wafer W and has a suction port (not illustrated) opened therein. The spin chuck 21 horizontally holds the wafer W by attracting a central portion of the back surface of the wafer W. The lower side of the spin chuck 21, which forms a stage on which the wafer W is placed in this manner, is connected to a rotation mechanism 22. The lower side of the rotation mechanism 22 is introduced into the lower space 16, and is supported from bottom by a support stand 23. Reference numeral 24 in FIG. 1 denotes a pipe connected at the upstream side thereof to the spin chuck 21. The pipe 24 is connected to an exhaust source 20 via a valve V1, and the spin chuck 21 is switched between suction and stopping of suction by opening or closing the valve V1. The exhaust source 20 is, for example, an exhaust path of a factory in which the substrate processing apparatus 1 is provided, and is at a negative pressure below the atmospheric pressure.

The spin chuck 21 is rotated around the vertical axis with the central axis thereof as a rotation axis by the rotation mechanism 22 that forms a relative rotation mechanism. In addition, the transfer mechanism 110 and the wafer holding unit 5 to be described later place the wafer W on the spin chuck 21 so that the center of the wafer W is positioned on the central axis of the spin chuck 21. Thus, the spin chuck 21 rotates the wafer W with the center thereof as a rotation center, thus causing the orientation of the wafer W to be changed. The spin chuck 21, the rotation mechanism 22, and a movement mechanism 51 to be described later constitute a holding position changing mechanism that changes a position where the back surface of the wafer W is held.

The light irradiation unit 3, which is configured in a rectangular block shape, is provided in the inner side of the upper space 15. An ultraviolet lamp 31 is arranged within the light irradiation unit 3. The upper surface of the light irradiation unit 3 is formed as a horizontal surface, and a portion of the upper surface is configured as a rectangular window 32 which is elongated in the Y direction. The window 32 is positioned above the ultraviolet lamp 31. The light emitted from the ultraviolet lamp 31 passes through the window 32 and travels upward of the light irradiation unit 3. The light emitted from the window 32 in this manner is light having the above-described wavelength. The ultraviolet lamp 31 and the window 32 constitute a light irradiator.

As will be described in detail later, when performing light irradiation while moving the wafer W in the X direction by the wafer holding unit 5, the processing is performed such that a diametric region in the Y direction of the wafer W is irradiated with light. Therefore, the length of the window 32 in the Y direction is equal to or greater than the diameter of the wafer W. Then, the center of the spin chuck 21 and the center of the window 32 in the Y direction are aligned in the X direction.

Further, the upper surface of the light irradiation unit 3 is slightly higher than the upper surface of the spin chuck 21. This is for providing sufficient light energy to the wafer W by bringing the window 32 and the back surface of the wafer W close to each other without changing the height of the wafer holding unit 5 while the wafer holding unit 5 is moved in the X direction for implementing light irradiation after the wafer holding unit 5 is raised and receives the wafer W from the spin chuck 21. That is, it is not necessary to adjust the height of the wafer holding unit 5 after receiving the wafer W, which contributes to an improvement in throughput.

In the upper surface of the light irradiation unit 3, a gas outlet 33 that extends in the Y direction and has a slit shape is formed at the front side of the window 32. When viewed in the Y direction, the length of the gas outlet 33 is greater than the length of the window 32, and one end and the other end of the gas outlet 33 are located closer to the sidewall of the housing 11 than one end and the other end of the window 32. This gas outlet 33 is formed so as to be open obliquely upward toward the inner side.

The downstream side of the pipe 34 is connected to the light irradiation unit 3 (see FIG. 1), and the upstream side of the pipe 34 is connected to a source 36 of a nitrogen ($N_2$) gas via a flow rate adjuster 35. The flow rate adjuster 35 includes, for example, a valve or a mass flow controller, and adjusts a flow rate of the $N_2$ gas supplied to the downstream side of the pipe 34. This adjustment of the flow rate also includes setting the flow rate to zero, that is, stopping the supply of gas. In addition, it is noted that any flow rate adjuster other than the flow rate adjuster 35 to be described later is also configured in the same manner as the flow rate adjuster 35 to adjust the flow rate of gas supplied to the downstream side of the pipe.

The $N_2$ gas supplied to the pipe 34 is discharged from the gas outlet 33. Due to the above-described positional relationship between the gas outlet 33 and the window 32, the airflow of the $N_2$ gas is created from one end to the other end of the window 32 in the Y direction to purge the atmosphere inward of the housing 11. The $N_2$ gas flows laterally between the back surface of the wafer W and the window 32 when the wafer W is irradiated with light. Thereby, the concentration of oxygen on the back side of the wafer W is reduced during light irradiation. The gas outlet 33 of the light irradiation unit 3 for supplying the $N_2$ gas as a purge gas in this manner forms a second purge gas discharge part.

A horizontal plate 37 is provided so as to extend from the inner upper rim of the light irradiation unit 3 toward the inner sidewall of the housing 11. Then, an exhaust port 41 is opened in the inner sidewall of the housing 11 so as to face the space above the plate 37. In this regard, exhaust flow-path forming parts 42, 43 and 44 are arranged from top to bottom in the inner sidewall of the housing 11 from the outside of the housing 11. Each of the exhaust flow-path forming parts 42 to 44 has a flow path connected to the exhaust source 20. Then, the exhaust port 41 is connected to the flow path provided in the exhaust flow-path forming part 42. Therefore, the $N_2$ gas discharged from the gas outlet 33 of the light irradiation unit 3 described above is guided by the plate 37 to flow inward in the upper space 15, and is discharged from the exhaust port 41.

A lighting power supply 45 is provided in a region from a central portion to the inner side of the lower space 16 in the Y direction. Electric power is supplied from the lighting power supply 45 to the ultraviolet lamp 31 via a cable 46 so that light irradiation is performed by the light irradiation unit 3 as already described. The lighting power supply 45 is switchable to supply electric power to the ultraviolet lamp 31 or to stop the supply of electric power, and thus, light irradiation from the ultraviolet lamp 31 is stopped when not needed. A fan 49 for cooling the lighting power supply 45 is provided at the inner side of the lighting power supply 45. The exhaust flow-path forming part 43 is provided at the same height as the fan 49, and an airflow generated by the fan 49 flows to the flow path of the exhaust flow-path forming part 43 through an opening in the inner sidewall of the housing 11.

In addition, an exhaust port 47 is opened in the inner sidewall of the housing 11 and is connected to the flow path of the exhaust flow-path forming part 44. As a result, particles generated from each part of the wafer holding unit 5 to be described later, which is provided in the lower space 16, are entrained in and removed by an exhaust flow flowing to the exhaust port 47. In addition, a slit 17 is opened in the partition plate 14 for communication between the upper space 15 and the lower space 16, and the upper space 15 is also evacuated by the exhaust port 47 through the slit 17.

Next, the wafer holding unit 5 will be described. The wafer holding unit 5 includes the movement mechanism 51 provided in the lower space 16 and a wafer transfer part 6 provided in the upper space 15, and the wafer transfer part 6 is configured to be movable in the X direction and be able to be raised and lowered by the movement mechanism 51.

The movement mechanism 51 includes a slider 53, a lifting mechanism 54, and a horizontal movement mechanism 55. The horizontal movement mechanism 55 is an elongated mechanism that extends in the X direction from the front side toward the inner side of the lower space 16, and is arranged in a region closer to the end of the X direction than the lighting power supply 45. The horizontal movement mechanism 55 includes a ball screw and a guide rail, each of which extends in the Y direction and is connected to the slider 53, and a motor arranged, for example, at the inner side of these ball screw and guide rail. The slider 53 is moved in the X direction along the guide rail as the ball screw is rotated by the motor.

In addition, a protection member that bundles up and protects, for example, a cable connected to the wafer holding unit 5 and each pipe connected to the wafer holding unit 5, which will be described later, is provided so as to come into contact with each of the slider 53 and the inner bottom of the housing 11. Then, the protection member guides the cable and the pipe to bend with the movement of the slider 53, and illustrations of the protection member and the cable are omitted. Then, for convenience of illustration, each pipe is illustrated as being dispersed without grouping in FIG. 1.

The lifting mechanism 54 is provided on the slider 53. The lifting mechanism 54 includes a motor 57 and a support 58. The support 58 includes a ball screw and a guide rail each extending along the vertical axis. The motor 57 and the support 58 correspond to a relative lifting mechanism. Then, they protrude to the upper space 15 through the slit 17 that is opened in the partition plate 14 so as to extend in the Y direction at the front side within the housing 11, and are connected to the wafer transfer part 6 in the upper space 15.

Figure 4:
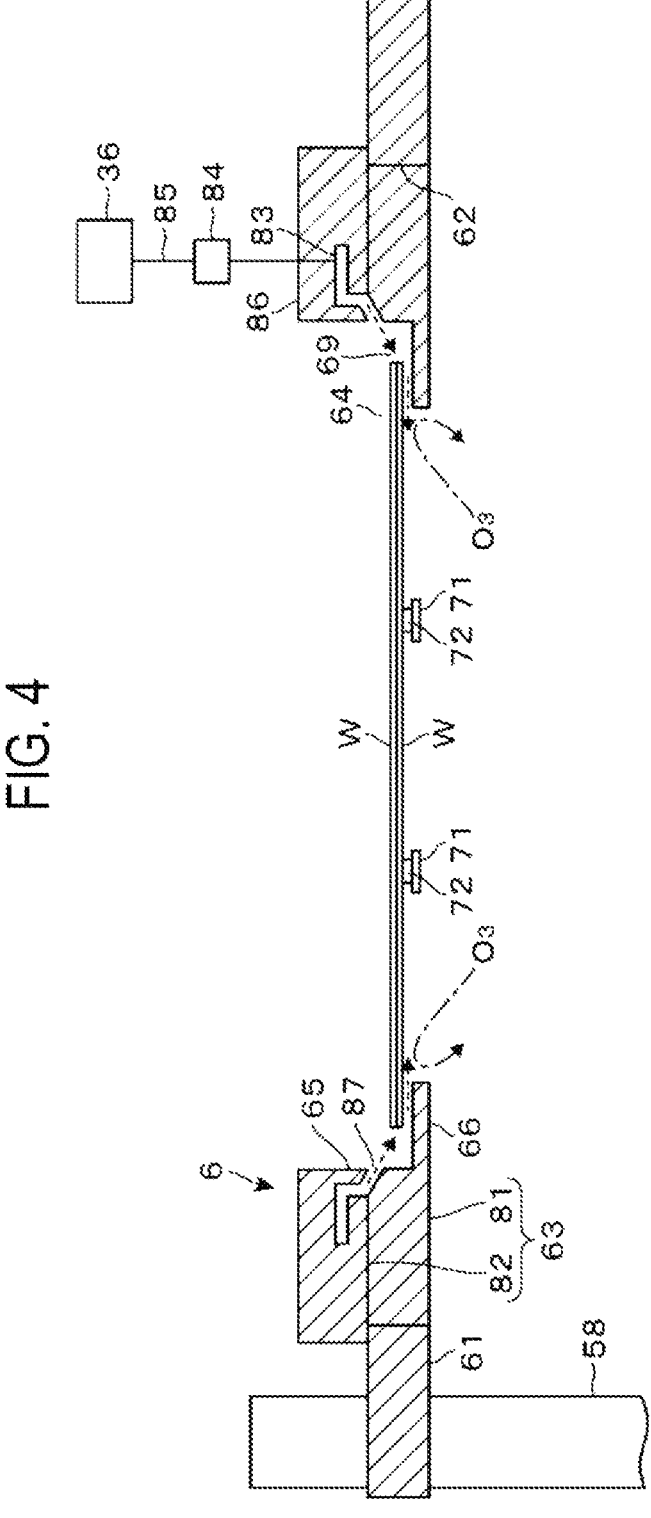
FIG. 4 is a longitudinal side view illustrating a wafer transfer part provided in the substrate processing apparatus.
Figure 5:
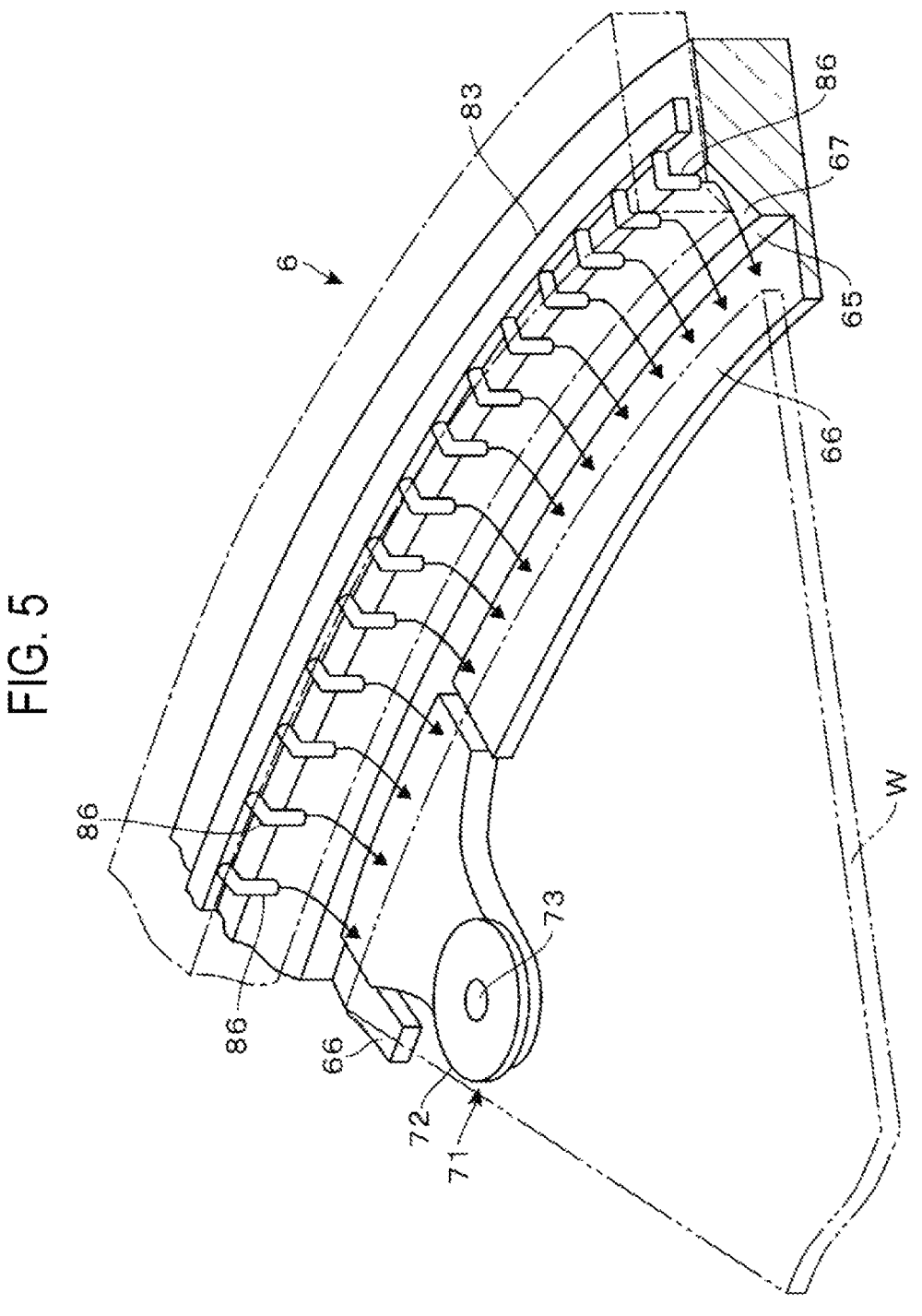
FIG. 5 is a perspective view of a holding ring constituting the wafer transfer part.

The wafer transfer part 6 will be described with reference to a longitudinal side view of FIG. 4 and a perspective view of FIG. 5. The wafer transfer part 6 includes a moving plate 61 and a holding ring 63. The moving plate 61 is a horizontal plate formed in a square shape in a plan view, and a circular opening 62 having a diameter slightly smaller than the length of one side of the square moving plate is formed in the moving plate 61. The ball screw and the guide rail constituting the support 58 of the movement mechanism 51 described above are connected to a region of the moving plate 61 outside the opening 62. Then, when the ball screw is rotated by the motor 57, the wafer transfer part 6 is raised and lowered in the vertical direction along the guide rail.

The holding ring 63 is supported on the inner peripheral edge of the opening 62 in the moving plate 61. The holding ring 63 is an annular member that is formed along the inner peripheral edge of the opening 62 and is thicker than the moving plate 61. A circular region 64 surrounded by the holding ring 63 forms a holding region in which the wafer W is received and held. The back surface of the wafer W is held by a wafer holder 71 to be described later, which is provided in the holding ring 63 so that the center of the wafer W is positioned at the center of the circular region 64. The holding ring 63 regulates the lateral position of the wafer W by surrounding the wafer W, thus forming a regulator that prevents the wafer W from being detached and falling from the wafer transfer part 6. In addition, since the holding ring 63 forms an enclosure surrounding the wafer W in this manner, the inner diameter of the holding ring 63 (=the diameter of the circular region 64) is slightly greater than the diameter of the wafer W.

The position of the center of the circular region 64 (=the center of the wafer W) in the Y direction when viewed in a plan view is aligned with the position of the center of the spin chuck 21 in the Y direction. Then, the wafer transfer part 6 is connected to the movement mechanism 51 as described above, thereby being movable in the X direction between a position (referred to as a transfer position) where the center of the circular region 64 matches with the center of the spin chuck 21 and a position where the center of the circular region 64 is at the inner side of the window 32. In addition, FIGS. 1 and 2 illustrate a state where the wafer transfer part 6 is located at the transfer position.

An inner peripheral surface 65 of the holding ring 63 is vertically formed to face the side surface of the wafer W held in the circular region 64. Then, a light shielding plate 66 is provided at the lower end of the inner peripheral surface 65 of the holding ring 63 so as to extend from each of four regions spaced apart from each other in the circumferential direction of the holding ring 63 toward the center of the circular region 64. Thus, each light shielding plate 66 is formed along the circumference of the wafer W, and a total of four light shielding plates 66 are provided at intervals in the circumferential direction.

This light shielding plate 66 is formed, for example, as a horizontal plate, and serves as a member for preventing the infiltration of light and the $O_3$ gas to the front side of the wafer W described above. Accordingly, the light shielding plate 66 is located at a height lower than the back surface of the wafer W held in the circular region 64. Since the inner peripheral edge (tip) of the light shielding plate 66 is formed along the circumferential end of the wafer W so as to realize the prevention of infiltration in each portion of the wafer W in the circumferential direction, each light shielding plate 66 is formed in an arc shape in a plan view. In addition, the respective light shielding plates 66 are close to each other in the circumferential direction, and form a substantially circular ring when collectively viewing the four light shielding plates 66. In this example, the inner peripheral edge of the light shielding plate 66 is located closer to the center of the circular region 64 than the circumferential end of the wafer W. That is, the tip end of the light shielding plate 66 and the circumferential end of the wafer W are superimposed in a plan view.

The wafer holder 71 is provided so as to protrude from each region of the lower end of the holding ring 63 where no light shielding plate 66 is provided toward the center of the circular region 64. Thus, four wafer holders 71 are provided on the holding ring 63 at intervals in the circumferential direction. Each wafer holder 71 is formed, for example, in a horizontal plate shape. As will be described later, the back surface of the wafer W is irradiated with light while the holding ring 63 is moved along the X direction. Each wafer holder 71 is disposed such that the wafer holder 71 (that is, a site of the holding ring 63 where no light shielding plate 66 is provided) is not located at and near a light irradiation area above the window 32 during the processing in this manner. Specifically, when grouping two wafer holders 71 at the front side into one set and two wafer holders 71 at the inner side into the other set, the two wafer holders 71 of the same set are arranged in the X direction, and the distance therebetween in the circumferential direction of the holding ring 63 is relatively short. Then, the distance between the wafer holders 71 of the different sets in the circumferential direction is relatively long.

Each wafer holder (substrate holder) 71 is formed such that the tip side thereof is narrower than the base side in a plan view. Further, the tip end of the wafer holder 71 is located closer to the center of the circular region 64 than the tip end of the light shielding plate 66, and the upper side of the wafer holder 71 is configured as a circular pad 72. The upper surface of the pad 72 serving as a suction part forms a horizontal placement surface on which a peripheral edge portion of the back surface of the wafer W is placed, and has a suction hole 73 opened therein. The suction hole 73 is connected to the exhaust source 20 through an exhaust path (not illustrated) provided in the wafer holder 71 and the holding ring 63 and also through a pipe 74. The suction hole 73 is switched between exhaust and stopping of exhaust by opening or closing a valve V2 interposed in the pipe 74. For example, the valve V2 is opened while the wafer W is placed on the pad 72, and the back surface of the wafer W is held horizontally by being suctioned and attracted by the pad 72. The valve V2 is closed while the wafer W is not placed on the pad 72. In this way, the wafer holder 71 is locally superimposed on the back surface of the wafer W to hold the wafer W.

In addition, as described above, the wafer transfer part 6 may be raised and lowered in the upper space 15 by being connected to the movement mechanism 51. More specifically, the wafer transfer part 6 is movable between a lower height at which the wafer holder 71 is below the spin chuck 21 and an upper height at which the wafer holder 71 is above the window 32 of the light irradiation unit 3, so as to enable the light irradiation of the wafer W by movement in the X direction and the transfer of the wafer W to the spin chuck 21. FIG. 1 illustrates a state where the wafer transfer part 6 is located at the upper height.

Figure 6:
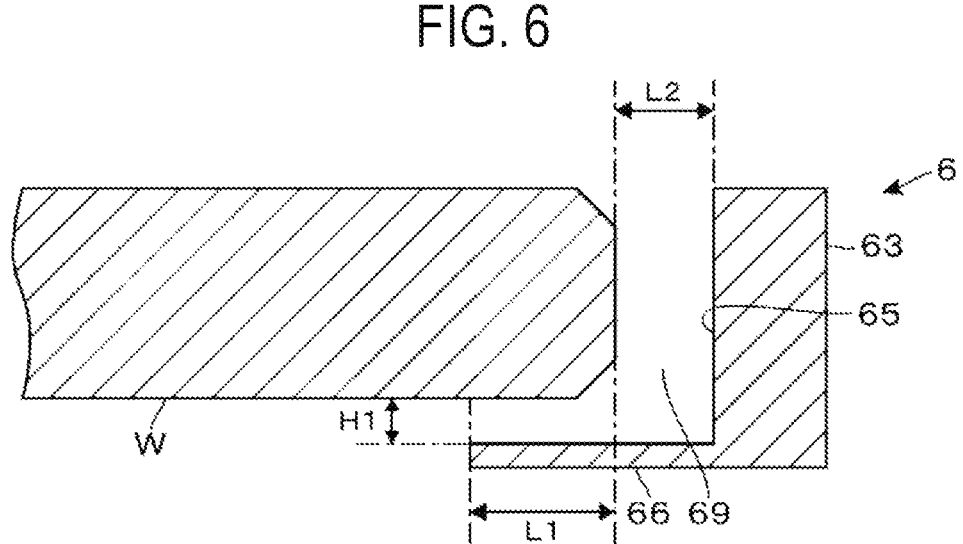
FIG. 6 is a longitudinal side view of the holding ring and a wafer processed by the substrate processing apparatus.

In this regard, as illustrated in a longitudinal side view of FIG. 6, the light shielding plate 66 is spaced apart downward from the back surface of the wafer W, so as not to interfere with light irradiation on the circumferential end of the back surface of the wafer W while preventing the infiltration (diffraction) of light to the front surface of the wafer W held on the pad 72. Moreover, a height distance H1 between the upper surface of the light shielding plate 66 and the back surface of the wafer W and a distance (lateral distance) L1 between the circumferential end of the wafer W and the tip (inner peripheral edge) of the light shielding plate 66 in the transverse direction are set to appropriate values, respectively. In other words, the infiltration of light to the front side of the wafer W is prevented by such a setting of the respective distances H1 and L1. Further, with the setting of these H1 and L1, a gap 69 formed among the wafer W, the light shielding plate 66, and the inner peripheral surface 65 of the holding ring 63 is set to be relatively small, so as to obtain an appropriate pressure loss by which the infiltration of the $O_3$ gas from the back side to the front side of the wafer W is prevented. Although the preferred ranges of these height distance H1 and lateral distance L1 will also be described later with regard to evaluation tests, it is assumed in this example that the height distance H1 is set to 2.95 mm and the lateral distance L1 is set to 1.0 mm. In addition, when defining the lateral distance L1 in more detail, it is a distance that the inner peripheral edge of the light shielding plate 66 extends toward the center of the circular region 64 on the basis of the circumferential end of the wafer W. Although it will also be described later with regard to evaluation tests, this lateral distance L1 may have a negative value.

In order to more reliably prevent the infiltration of the $O_3$ gas described above, the holding ring 63 is configured as a first purge gas discharge part that discharges the $N_2$ gas as a purge gas toward the above gap 69. To give a more detailed description of a configuration of the holding ring 63, the holding ring 63 includes a lower ring 81 and an upper ring 82, which configure the lower side and the upper side of the holding ring 63, respectively, and the upper ring 82 covers the lower ring 81 from the top side. Thus, the inner peripheral surface 65 of the holding ring 63 is configured by the respective inner peripheral surfaces of the lower ring 81 and the upper ring 82. The light shielding plate 66 is provided on the lower ring 81. The upper surface of the lower ring 81 forms a horizontal surface at the outer peripheral edge of the ring and also forms an inclined surface at the inner peripheral edge of the ring, and the inclined surface is inclined downward from the horizontal surface toward the inner end of the ring.

The outer peripheral edge of the upper ring 82 protrudes to the outside of the lower ring 81 and is supported on the opening rim of the moving plate 61. An annular flow path 83 is defined within the upper ring 82 along the circumferential direction of the upper ring 82. The annular flow path 83 is connected to the source 36 of the $N_2$ gas through a pipe 85 with a flow rate adjuster 84 interposed therein. Then, a plurality of sites of the annular flow path 83 at the inner peripheral edge, which are spaced apart from each other in the circumferential direction, are pulled out to the inner peripheral edge, and then are bent downward, thus forming flow paths 86, respectively. The lower surface of the upper ring 82 forms a horizontal surface at the outer peripheral edge of the ring and also forms an inclined surface at the inner peripheral edge of the ring, with the inclined surface being inclined downward from the horizontal surface toward the inner end of the ring. The downstream end of the flow path 86 is open to this inclined surface.

The horizontal surface of the lower ring 81 and the horizontal surface of the upper ring 82 described above are joined to each other. Then, the inclined surface of the lower ring 81 and the inclined surface of the upper ring 82 face each other at an interval, thus forming a gas outlet 87 as an annular slit that is open over the entire circumference of the inner peripheral surface 65. Thus, the gas outlet 87 is formed in the oblique direction so as to be inclined downward from the outer periphery to the inner periphery of the holding ring 63, and forms a first purge gas outlet. Further, the gas outlet 87 is open to above the wafer W held by the wafer holder 71. That is, it is open to above the gap 69 formed by the wafer W as described above. Then, the gas outlet 87 is open to the direction facing the gap 69. With the above configuration, the $N_2$ gas is discharged from the entire gas outlet 87, and the gap 69 is purged from top. This flow of $N_2$ gas as a purge gas is indicated by dotted-line arrows and solid-line arrows, respectively, in FIGS. 4 and 5.

As described above, the gap 69 is a gap formed among the wafer W, the light shielding plate 66, and the inner peripheral surface 65 of the holding ring 63, and is formed in an L-shape when viewed in the longitudinal cross-section as the inner peripheral surface 65 and the upper surface of the light shielding plate 66 are respectively spaced apart from the wafer W. In addition, an L-shaped gap is formed similarly among the wafer W, the upper surface of the wafer holder 71, and the inner peripheral surface 65 when viewed in the longitudinal cross-section, and is connected to the gap 69 in the circumferential direction of the holding ring 63. Since the purge gas is discharged from the entire circumference of the gas outlet 87, it is also supplied to the L-shaped gap formed by the wafer holder 71.

Figure 2:
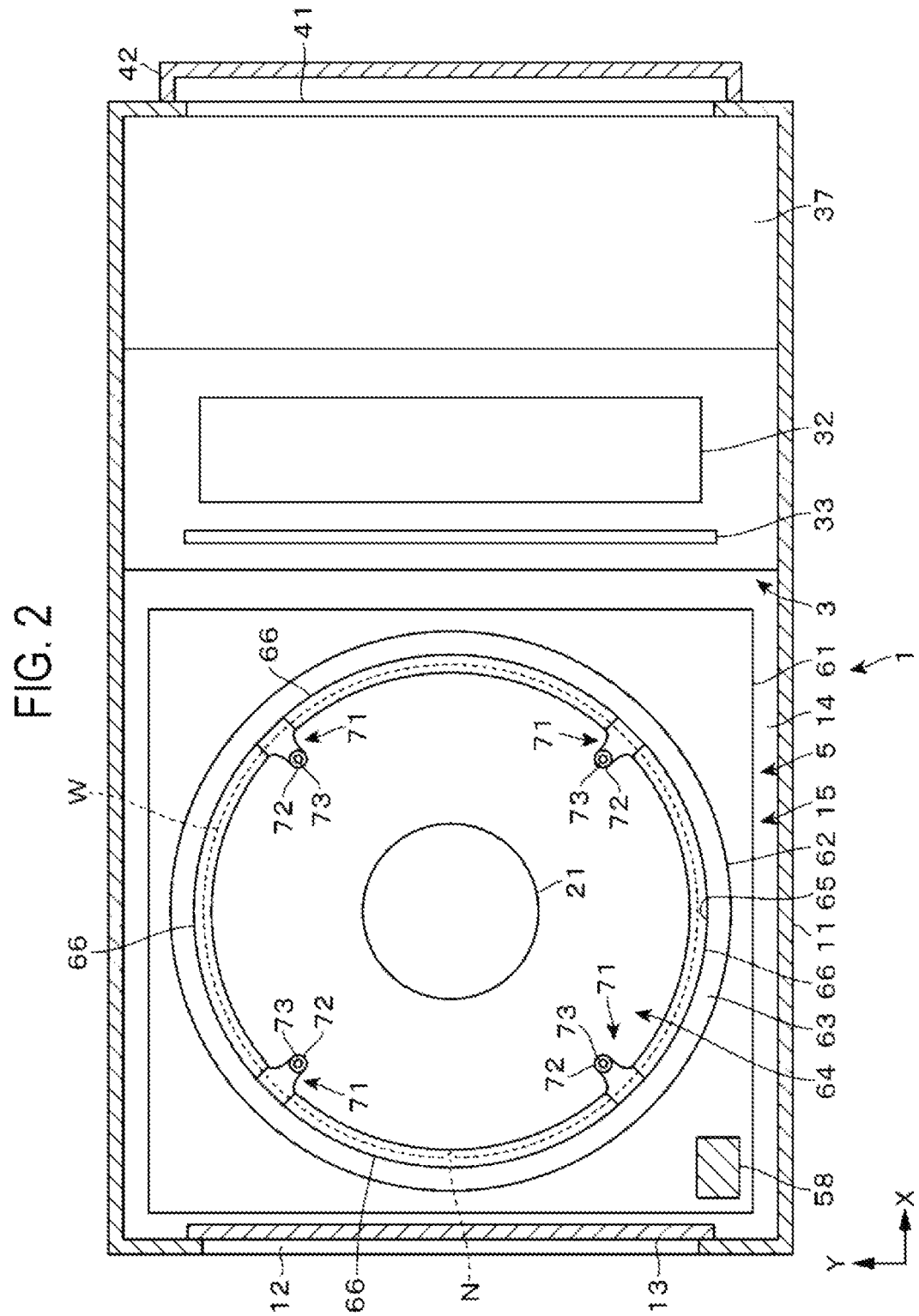
FIG. 2 is a cross-sectional plan view of the substrate processing apparatus.

The substrate processing apparatus 1 includes a controller 10 (see FIG. 1). The controller 10 includes, for example, a computer, and stores a program therein. This program incorporates a group of steps to allow the substrate processing apparatus 1 to perform a series of operations. Then, the controller 10 outputs a control signal to each part of the substrate processing apparatus 1 to control an operation of each part according to the program. Specifically, individual operations, such as the horizontal movement and lifting of the wafer transfer part 6 by the movement mechanism 51, the rotation of the spin chuck 21 by the rotation mechanism 22, the adjustment of the flow rate of the $N_2$ gas by each flow rate adjuster, the power on/off to the ultraviolet lamp 31 by the lighting power supply 45, and the like are controlled. The program is installed in the controller 10 by being stored in a non-transitory computer-readable storage medium such as a compact disk, a hard disk, or a DVD, for example.

Next, a process of processing the wafer W by the substrate processing apparatus 1 will be described with reference to FIGS. 7 to 18. In the process views of FIGS. 7 to 18, a side view is illustrated at the left side and a plan view is illustrated at the right side, and the side view and the plan view in the same drawing illustrate the state of the apparatus at the same timing. In addition, the implementation of light irradiation by the light irradiation unit 3 is indicated by giving a large number of dots to the window 32 of the light irradiation unit 3 in the side view. Further, when the wafer W is superimposed so as to cover both the wafer holder 71 and the spin chuck 21 of the wafer transfer part 6, only the side holding the wafer W is indicated by dotted lines and the other side not holding the wafer W is not indicated in a plan view. Further, the purge gas (the $N_2$ gas) discharged from each of the light irradiation unit 3 and the wafer transfer part 6 is indicated by arrows.

Further, in addition to FIGS. 7 to 18, FIGS. 19 to 22, which are plan views illustrating a positional relationship between the back surface of the wafer W and the window 32 in the light irradiation unit 3, will also be referred to as appropriate. Since light is emitted upward of the window 32, these drawings illustrate a light irradiation area. Then, in FIGS. 19 to 22, a region of the back surface of the wafer W irradiated with light (that is, a region where the organic film M was removed) is indicated by diagonal lines. To irradiate the entire back surface with light as described above, light irradiation is performed twice. Some regions are repeatedly irradiated with light and are indicated by diagonal lines crossing each other to form a mesh pattern.

Figure 7:
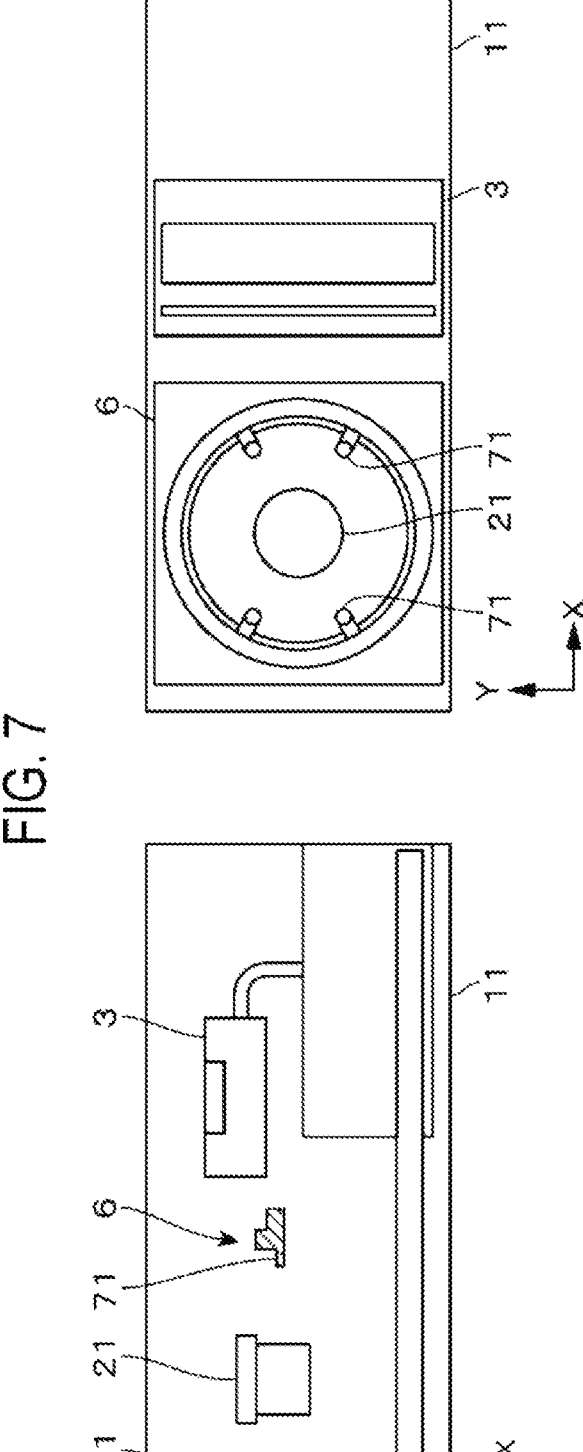
FIG. 7 is an explanatory diagram illustrating an operation of the substrate processing apparatus.
Figure 8:
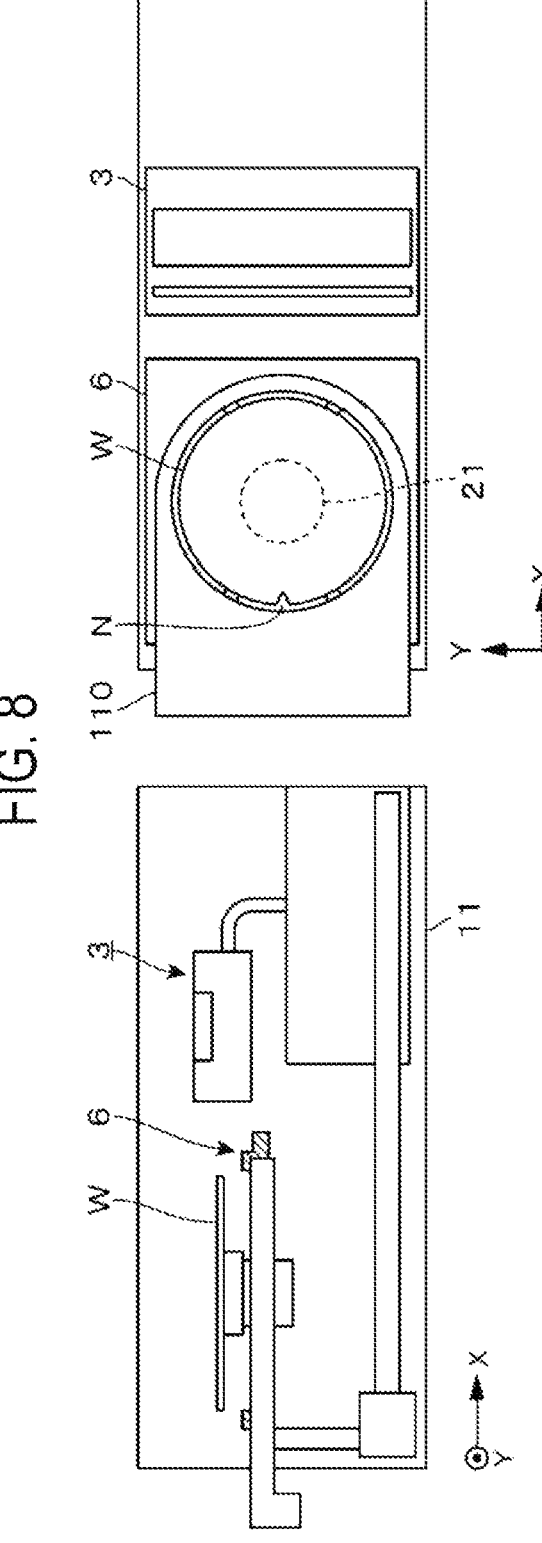
FIG. 8 is an explanatory diagram illustrating an operation of the substrate processing apparatus.
Figure 9:
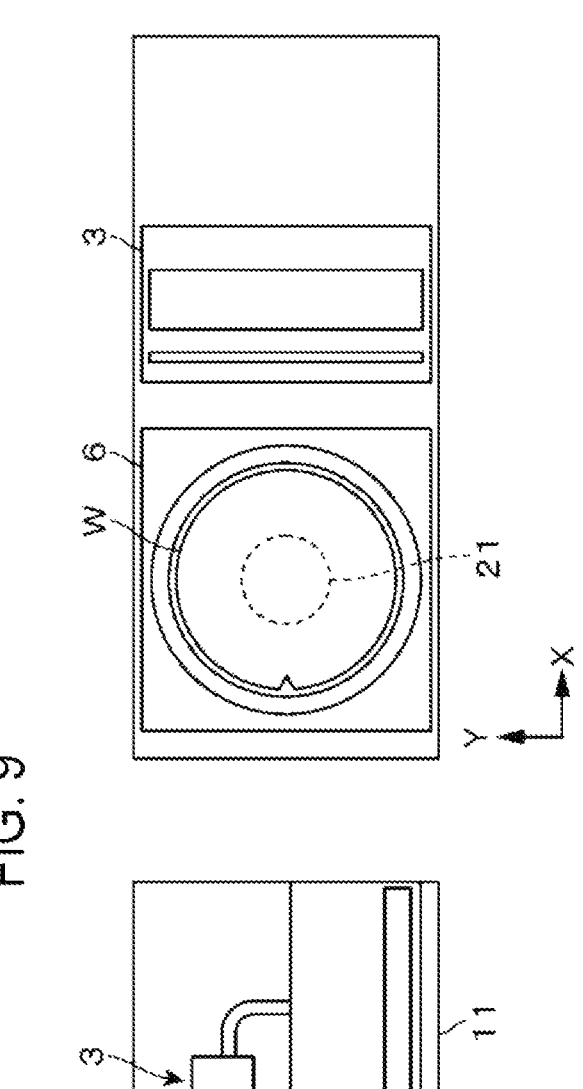
FIG. 9 is an explanatory diagram illustrating an operation of the substrate processing apparatus.

FIG. 7 is a state before the wafer W is loaded into the housing 11. At this time, the wafer transfer part 6 is located at the lower height in the transfer position, and suction is not being performed from the wafer holder 71 of the wafer transfer part 6. Then, the light irradiation unit 3 is not performing light irradiation. Suction by the spin chuck 21 is being performed, and thus, the spin chuck 21 is in a state capable of attracting the wafer W. In such a state, the substrate transfer mechanism 110 supporting the wafer W is introduced into the upper space 15 within the housing 11 through the transfer port 12, and is lowered, thereby causing the wafer W to be attracted to and held by the spin chuck 21. The notch N of the wafer W is directed in the X direction (FIG. 8).

Subsequently, once the substrate transfer mechanism 110 is retracted from the interior of the housing 11 (FIG. 9), the wafer transfer part 6 is raised, suction by the spin chuck 21 is stopped, and suction from the wafer holder 71 is started (step 51). The wafer W is transferred from the spin chuck 21 to the wafer holder 71 and is attracted to and held by the wafer holder 71, and the wafer transfer part 6 is located at the upper height. Meanwhile, the purge gas begins to be discharged from the gas outlet 87 in the holding ring 63 of the wafer transfer part 6. Further, the purge gas also begins to be discharged from the gas outlet 33 of the light irradiation unit 3 (step S2, FIG. 10).

Figure 11:
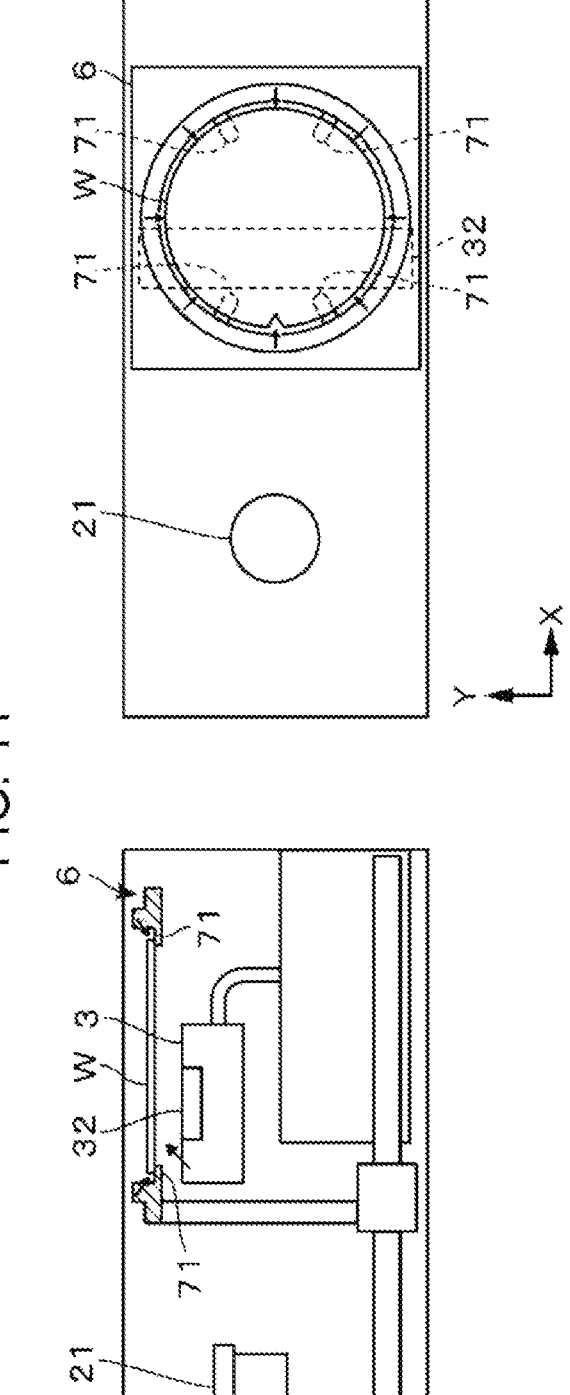
FIG. 11 is an explanatory diagram illustrating an operation of the substrate processing apparatus.
Figure 12:
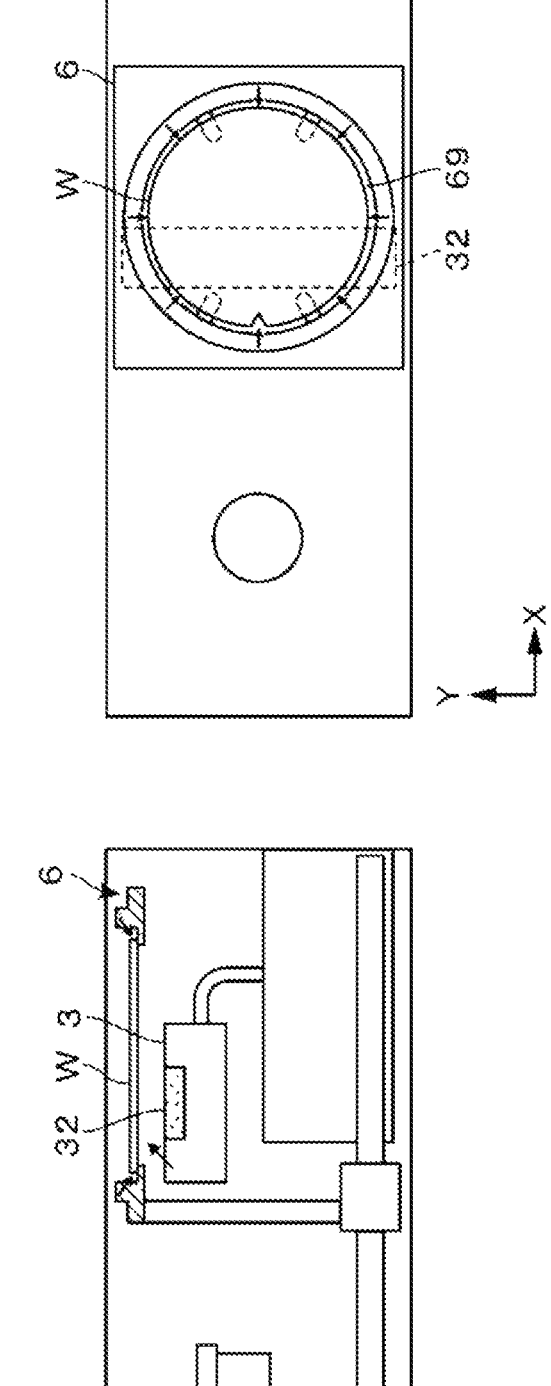
FIG. 12 is an explanatory diagram illustrating an operation of the substrate processing apparatus.
Figure 13:
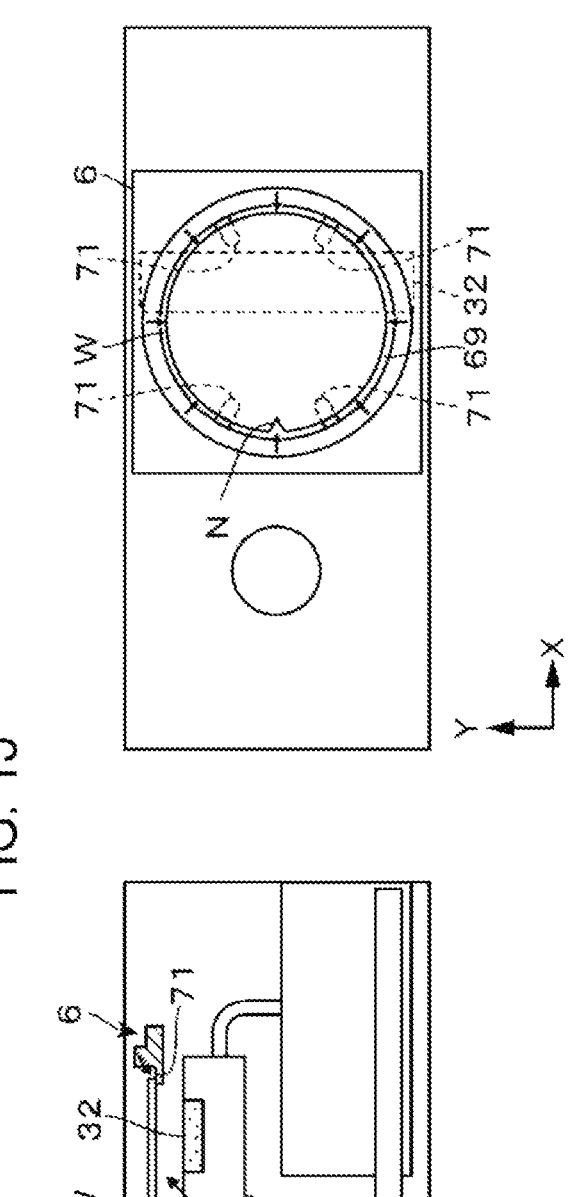
FIG. 13 is an explanatory diagram illustrating an operation of the substrate processing apparatus.
Figure 19:
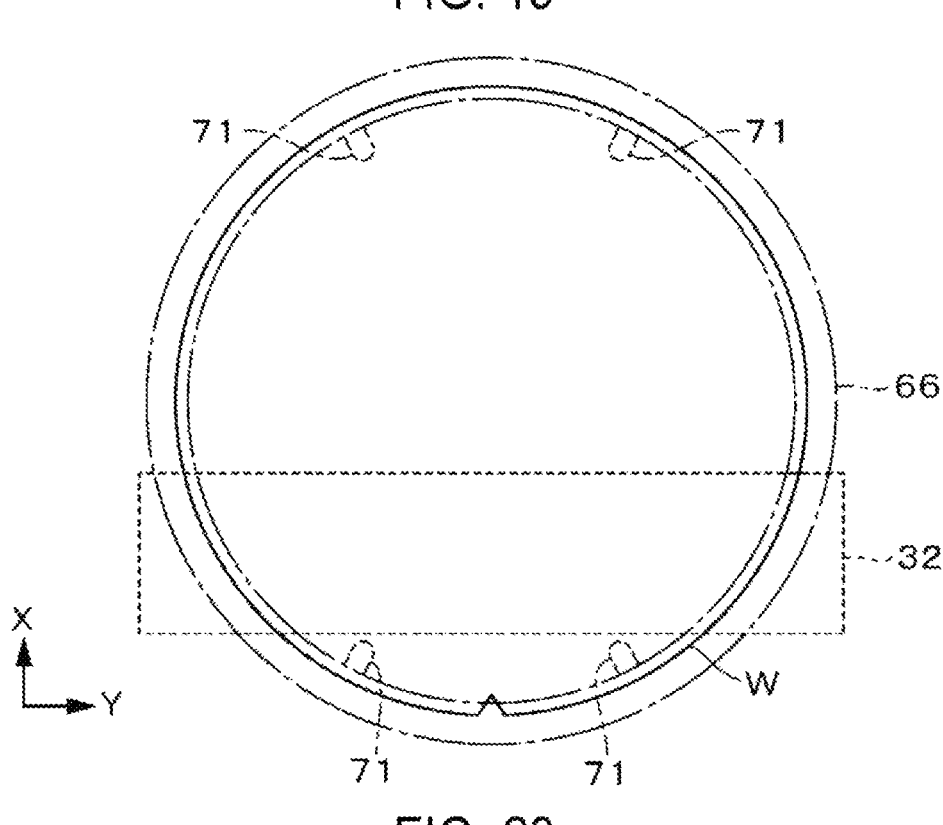
FIG. 19 is a plan view illustrating the back surface of the wafer.

After that, the wafer transfer unit 6 is moved inward, and then stops (step S3, FIGS. 11 and 19). This stop position is a position where the window 32 is at the front side of the center of the wafer W and is also at the inner side of two of the four wafer holders 71 at the front side. The stop position will hereinafter be referred to as a light irradiation start position. Then, light irradiation by the light irradiation unit 3 is started, and the organic film M is removed from a region of the back surface of the wafer W superimposed on the window 32 (step S4, FIG. 12). Then, as the wafer transfer part 6 is moved forward while the light irradiation continues, the range within which the organic film M is removed from the back surface of the wafer W is widened.

While the back surface of the wafer W is subjected to the light irradiation processing in this manner, a part of irradiation light is blocked by the light shielding plate 66 of the wafer transfer part 6, the inner peripheral edge of which is provided to follow the circumferential end of the wafer W, and does not reach the wafer W, thereby preventing the infiltration of light to the front side of the wafer W. Then, since the concentration of oxygen on the window 32 is relatively low due to purging by the purge gas from the gas outlet 33, the generation of the $O_3$ gas is restricted.

When a relatively small amount of $O_3$ gas generated on the back side of the wafer W is supplied to the organic film M in this manner, the organic film M is decomposed. That is, the removal of the organic film M progresses by the action of each of irradiation light and the $O_3$ gas. Since the light shielding plate 66 and the holding ring 63 are close to the wafer W and the gap 69 around the wafer W is relatively small, the $O_3$ gas generated on the back side of the wafer W is prevented from infiltrating to the front side of the wafer W through the gap 69. Further, the purge gas, which is discharged downward from the wafer transfer part 6 toward the outer periphery of the wafer W, enters the upper side of the gap 69, and flows from the lower side of the gap 69 (between the back surface of the wafer W and the light shielding plate 66) toward the center of the wafer W. Therefore, as indicated by dashed-line arrows in FIG. 4, even if the $O_3$ gas is directed to the lower side of the gap 69, the $O_3$ gas is pushed out by this purge gas, thereby being prevented from entering the lower side of the gap 69. Therefore, the supply of $O_3$ gas to the front side of the wafer W is more reliably prevented.

Figure 14:
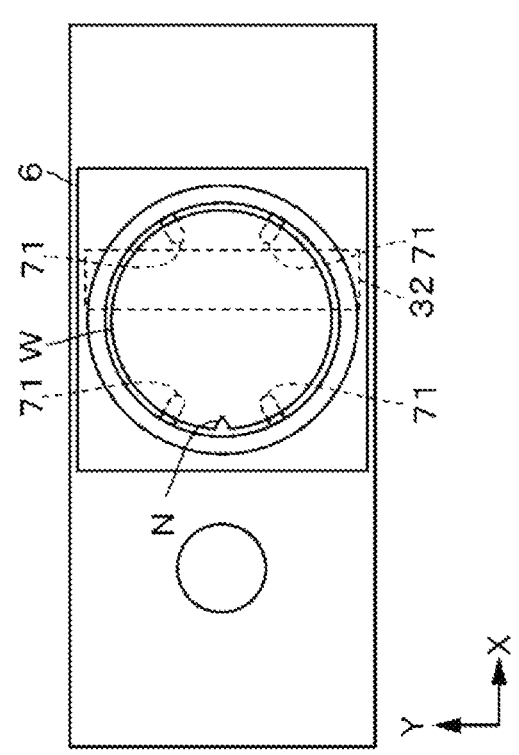
FIG. 14 is an explanatory diagram illustrating an operation of the substrate processing apparatus.
Figure 20:
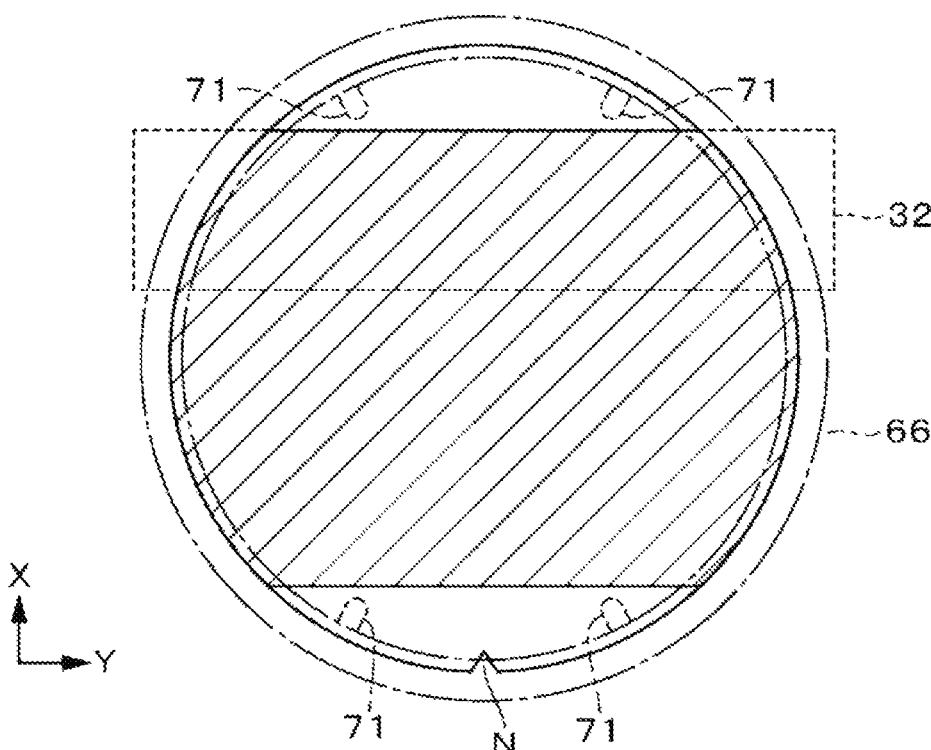
FIG. 20 is a plan view illustrating the back surface of the wafer.

Then, when the wafer transfer part 6 continues to move and is moved to a predetermined position (referred to as a light irradiation stop position) (FIGS. 13 and 20), light irradiation is stopped, and at the same time, the discharge of the purge gas from the gas outlet 87 of the holding ring 63 and the gas outlet 33 of the light irradiation unit 3 is stopped (step S5, FIG. 14). This light irradiation stop position is a position where the window 32 is at the inner side of the center of the wafer W and is also at the inner side of two of the four wafer holders 71 at the inner side. Accordingly, as illustrated in FIG. 20, at this point in time, a thick band-shaped region of the back surface of the wafer W that extends along the Y direction and passes through the diameter of the wafer W is completely irradiated with light, and the organic film M is removed from that region. On the other hand, the organic film M remains on the back surface of the wafer W at the front end and the inner end thereof.

Figure 15:
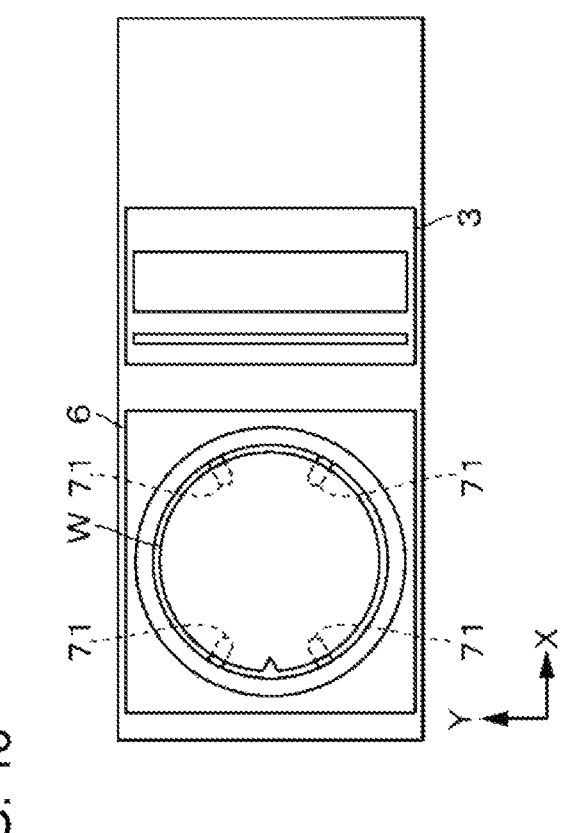
FIG. 15 is an explanatory diagram illustrating an operation of the substrate processing apparatus.
Figure 16:
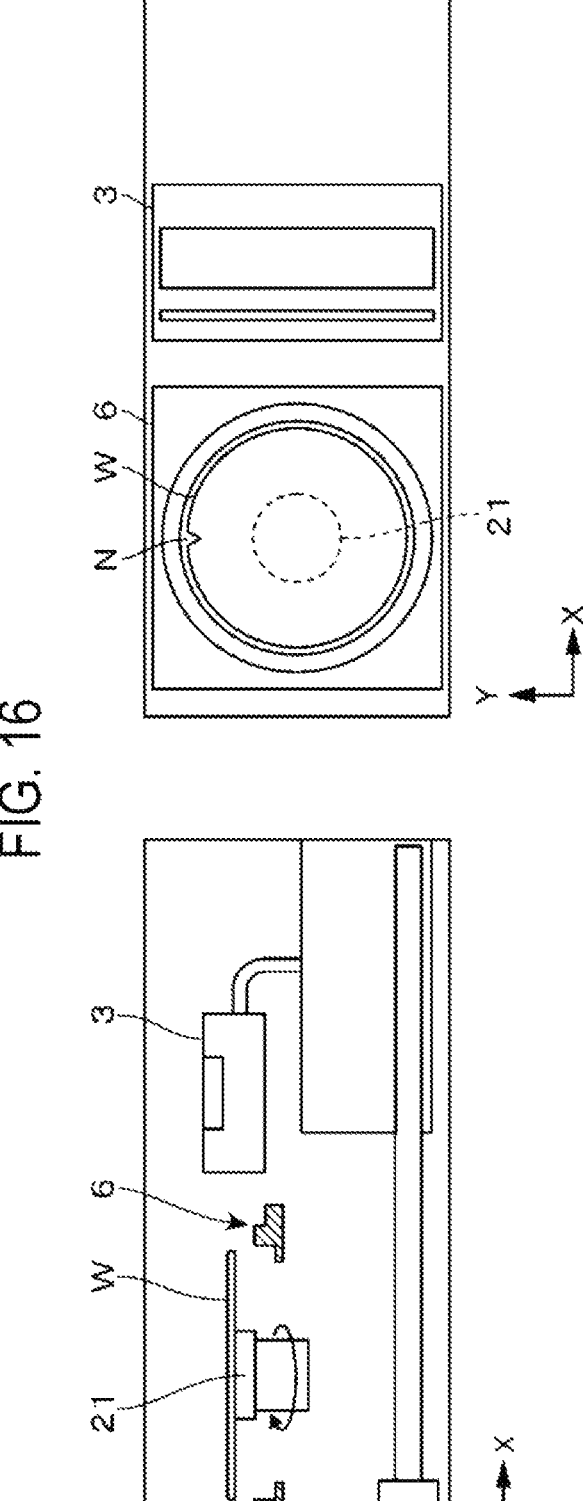
FIG. 16 is an explanatory diagram illustrating an operation of the substrate processing apparatus.

The wafer transfer part 6 continues to move forward even after light irradiation is stopped, and returns to the transfer position (step S6, FIG. 15). Then, the holding ring 63 is lowered, suction from the spin chuck 21 is performed, and at the same time, suction from the wafer holder 71 is stopped. As such, the wafer W is attracted to and held by the spin chuck 21, and the holding ring 63 is located at the lower height (step S7). After that, the spin chuck 21 is rotated to change the orientation of the wafer W by 90 degrees (step S8, FIG. 16). Thus, the notch N of the wafer W is directed in the Y direction.

Figure 17:
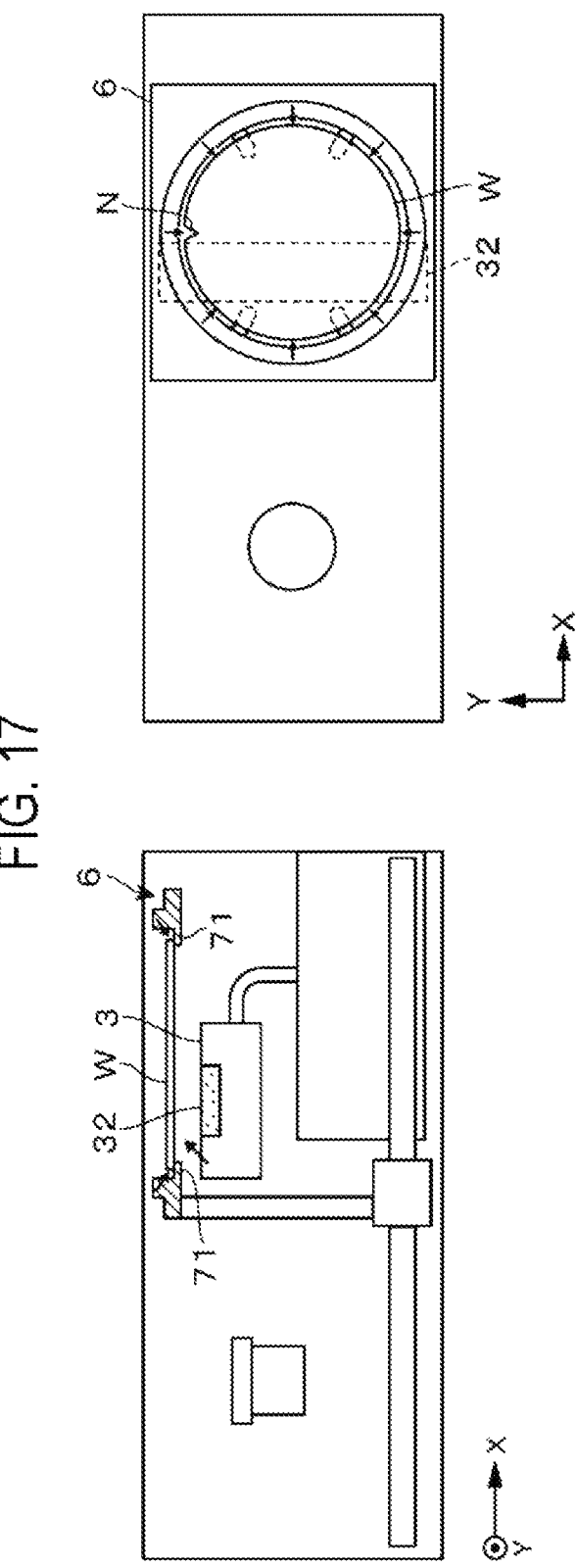
FIG. 17 is an explanatory diagram illustrating an operation of the substrate processing apparatus.
Figure 18:
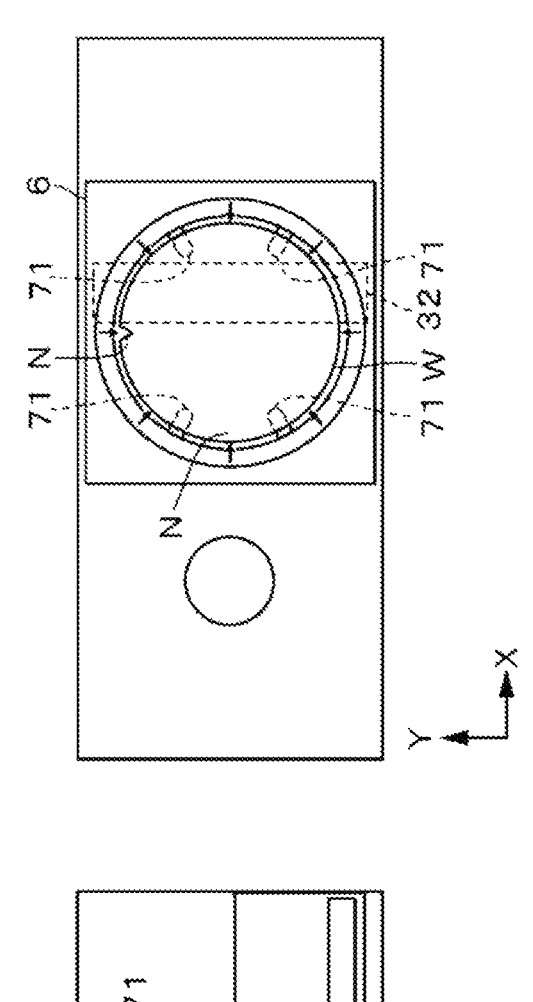
FIG. 18 is an explanatory diagram illustrating an operation of the substrate processing apparatus.
Figure 21:
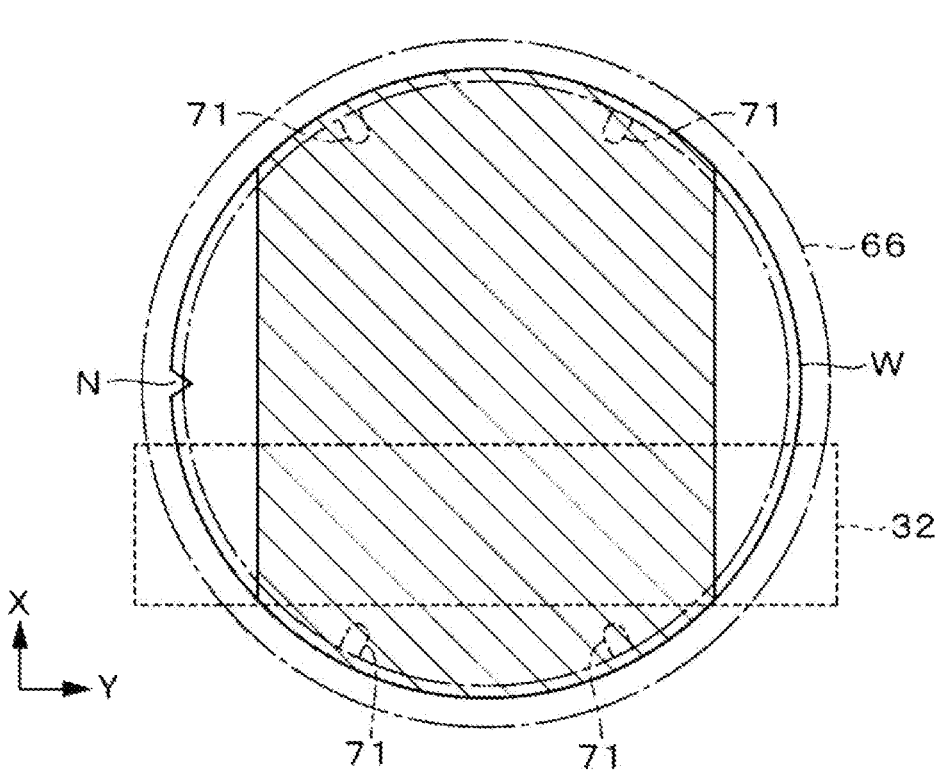
FIG. 21 is a plan view illustrating the back surface of the wafer.
Figure 22:
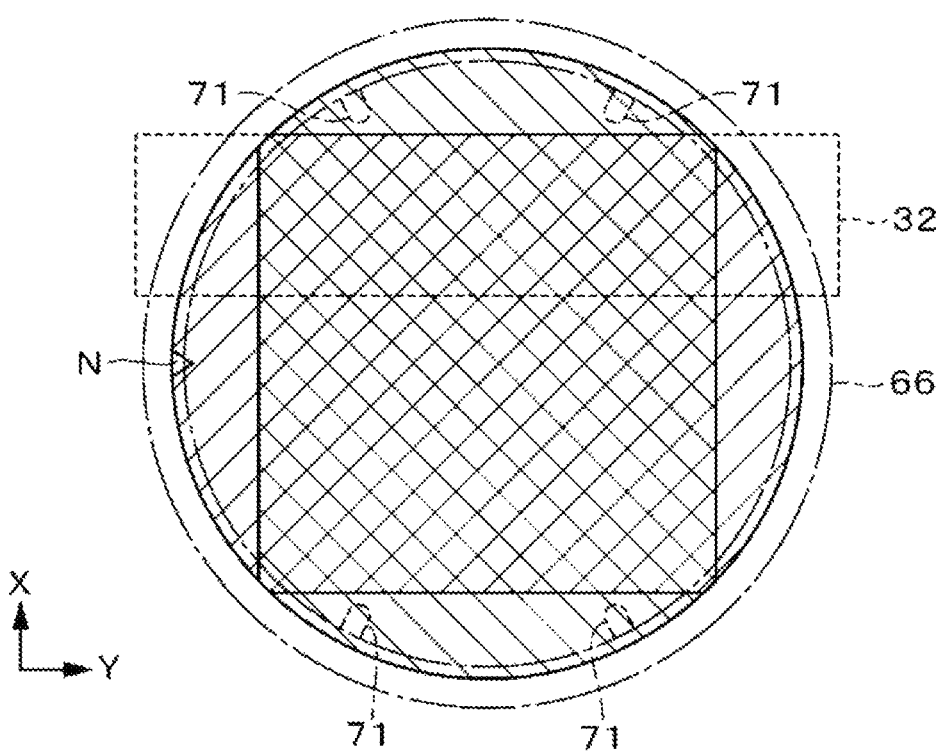
FIG. 22 is a plan view illustrating the back surface of the wafer.

Thereafter, the above steps S1 to S8 are performed again. In step S1 among the second rounds of steps S1 to S8, since the orientation of the wafer W was changed, the wafer holder 71 holds the wafer W while being superimposed on the back surface of the wafer W at a position (second position) different from the previous superimposed position (first position) in the first round of step S1. In the second rounds of steps S4 and S5, similarly to the first rounds of steps S4 and S5, when the wafer transfer part 6 is located at the light irradiation start position (FIG. 21), light irradiation is started (FIG. 17). After that, light irradiation is performed until the wafer transfer part 6 is moved to the light irradiation stop position. Since the orientation of the wafer W was changed in the first round of step S8, as illustrated in FIG. 21, in the second rounds of steps S4 and S5, a thick band-shaped region, which extends along the diameter of the wafer W so as to be orthogonal to the previously irradiated thick band-shaped region in the first rounds of steps S4 and S5, is irradiated with light, and the organic film M remaining in the first rounds of steps S1 to S8 is removed. Thereby, the organic film M is removed from the entire back surface of the wafer W (FIGS. 18 and 22).

Further, in a second round of step S8, similarly to the first round of step S8, the orientation of the wafer W is changed by 90 degrees by the spin chuck 21. This change in the orientation is made as the spin chuck 21 is rotated in the direction opposite to that in the first round of step S8. That is, the wafer W is returned to the same orientation as that when the wafer W is loaded into the housing 11, and has no difficulty in being processed in subsequent processes. After the second round of step S8, the substrate transfer mechanism 110 receives the wafer W in an operation reverse to that when the wafer W is loaded into the housing 11, and unloads the wafer W out of the housing 11.

As described above, according to the substrate processing apparatus 1, the supply of light to the front side of the wafer W by infiltration as well as the supply of the O₃ gas to the front side are prevented. Accordingly, a resist film as well as each of other films formed on the surface of the wafer W is prevented from being damaged or removed.

In the previously described example, the light shielding plate 66 is provided on substantially the entire circumference of the holding ring 63. However, only a limited range of the back surface of the wafer W is irradiated with light while the wafer transfer part 6 is moved in the X direction. Accordingly, the light shielding plate 66 is not limited to being provided on the entire circumference as described above. For example, among the four light shielding plates 66, the light shielding plate 66 between two wafer holders 71 at the front side and the light shielding plate 66 between two inner wafer holders 71 at the inner side may not be provided. Then, the purging of the gap 69 may also not be performed in the region where the light shielding plate 66 is not provided. Since there is no need to purge the entire circumference of the wafer W in this manner, the enclosure surrounding the side circumference of the wafer W is not limited to being configured as an annular body such as the holding ring 63, but may be configured by members arranged at intervals along the circumference of the wafer W. Specifically, the wafer W may be surrounded by an annular member with a cut in the middle thereof, so that the purge gas may be discharged from the member to the gap 69. Further, the light shielding plate 66 is not limited to protruding from the lower end of the inner peripheral surface 65 of the holding ring 63, but may be formed so as to protrude from a position above the lower end.

Further, for the purging of the gap 69, a nozzle that is separate from the holding ring 63 and is movable together with the holding ring 63 may be provided so that the purge gas is supplied from the nozzle above the gap 69. Further, the purge gas is not limited to being discharged from the outer periphery toward the center of the wafer W, but may be discharged vertically downward from directly above the gap 69. However, in order to enhance the effect of preventing the infiltration of the O₃ gas from the back side of the wafer W, as described above, it is desirable to form an airflow of the purge gas directed from the outer periphery toward the center of the wafer W at the lower side of the gap 69 (between the back surface of the wafer W and the light shielding plate 66). To this end, it is desirable to form an airflow directed toward the center of the wafer W by discharging the purge gas obliquely downward from the holding ring 63 described above.

In addition, the distance between the side surface of the wafer W and the inner peripheral surface 65 of the holding ring 63 is indicated as a lateral distance L2 in FIG. 6. This lateral distance L2 may be greater than the height distance H1, for example, as illustrated in FIG. 6. This relationship causes the purge gas to easily enter the gap 69, but makes it difficult for the O₃ gas to enter the gap 69. This is for more reliably obtaining the effect of preventing the infiltration of the O₃ gas to the front surface.

By the way, although preventing the infiltration of the O₃ gas to the front side of the wafer W has been described, the O₃ gas may be made to slightly infiltrate so as to remove a film formed in a region from the side surface of the wafer W to the circumferential end of the surface of the wafer W. As the amount of infiltration of the O₃ gas increases, the range within which the film is removed from the side surface to the surface center of the wafer W is widened. Specifically, the amount of infiltration in this manner may be controlled, for example, by controlling the operation of the flow rate adjuster 84 to control the flow rate of the purge gas discharged from the gas outlet 87 of the wafer transfer part 6. Since a preferred film removal range is different for each lot of the wafer W, for example, the processing may be performed by changing the flow rate by the flow rate adjuster 84 for each lot.

Figure 23:
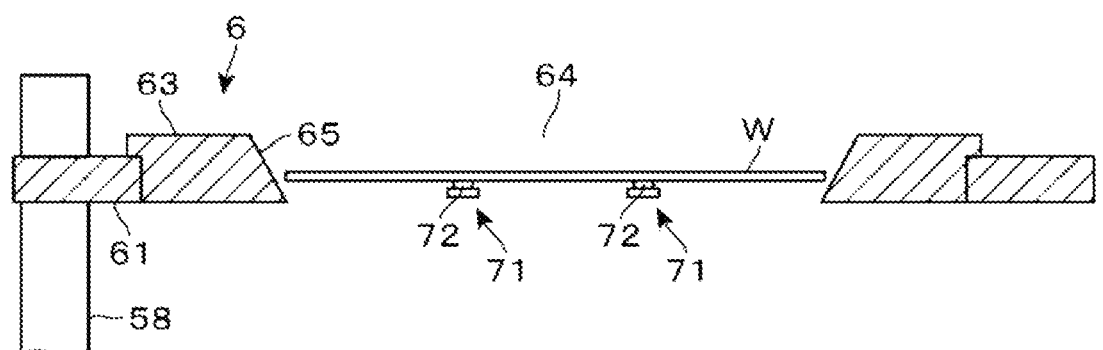
FIG. 23 is a longitudinal side view illustrating another configuration example of the holding ring.

In the previously described example, although a light shielding member is the light shielding plate 66 of a plate-shaped body protruding from the inner peripheral surface 65 of the wafer transfer part 6, the light shielding member is not limited to being formed as the plate-shaped body. In an example illustrated in FIG. 23, the inner peripheral surface 65 of the wafer transfer part 6 is an inclined surface which is inclined downward toward the center of the circular region 64. The lower end of this inclined surface is spaced apart from and located below the back surface of the wafer W and is configured as a light shielding member. Thus, for example, the inner peripheral edge of the lower end is located closer to the center of the circular region 64 than the circumferential end of the wafer W, and is formed along the circumferential end of the wafer W. In this way, in this example, the light shielding member is configured by a part of a block-shaped member.

Further, in the substrate processing apparatus 1, light irradiation is performed by moving the wafer transfer part 6 in the transverse direction relative to the light irradiation unit 3, but the movement mechanism 51, which forms a relative transverse movement mechanism, may be connected to the light irradiation unit 3 so that light irradiation is performed by moving the light irradiation unit 3 in the transverse direction relative to the wafer transfer part 6. In addition, to transfer the wafer W between the spin chuck 21 and the wafer transfer part 6, the lifting mechanism 54 of the movement mechanism 51 is configured to raise and lower the wafer transfer part 6, but the present disclosure is not limited to such a configuration. The wafer W may be transferred as the rotation mechanism 22 provided with the spin chuck 21 is connected to a lifting mechanism so that the spin chuck 21 and the rotation mechanism 22 are raised and lowered by the lifting mechanism.

Figure 24:
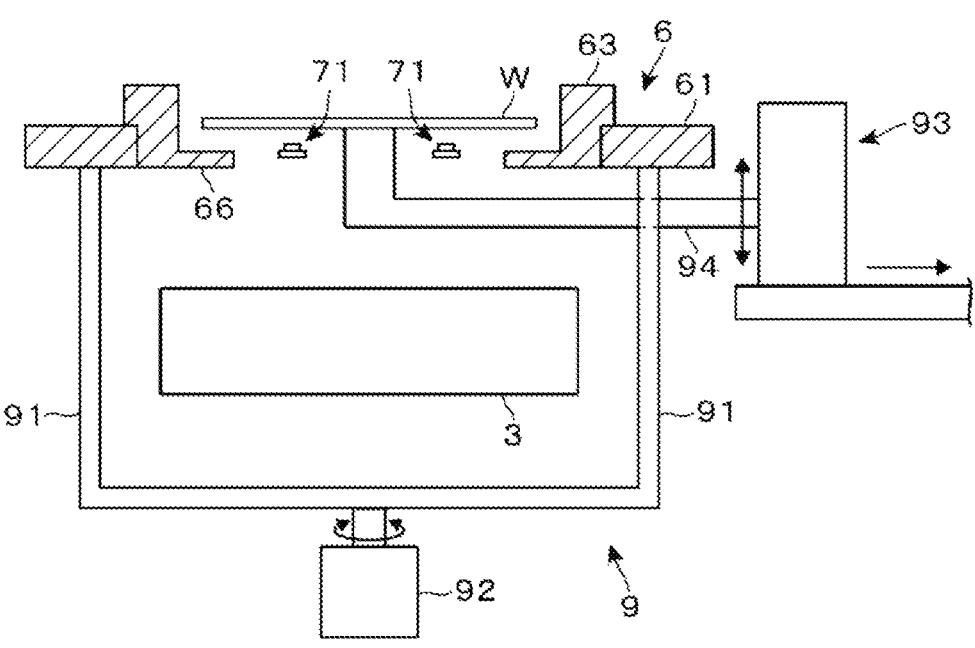
FIG. 24 is a side view illustrating a modification of the substrate processing apparatus.

A configuration example of another substrate processing apparatus will be described. In a substrate processing apparatus 9 illustrated in FIG. 24, the wafer transfer part 6 is connected at the bottom thereof to a rotation mechanism 92 via a plurality of posts 91, and may be changed in orientation by rotating around a central axis thereof. The light irradiation unit 3 is provided below the wafer transfer part 6. In this example, the window 32 (that is, the light irradiation area) is superimposed on the entire wafer W in a plan view. A movement mechanism 93 is provided at the lateral side of the posts 91. The movement mechanism 93 is responsible for raising or lowering and moving an arm 94 in the transverse direction. The arm 94 is movable between a support position (position illustrated in FIG. 24) where it is superimposed on the wafer W held by the wafer transfer part 6 and a retracted position where it is not superimposed on the wafer W. The arm 94 may also cause the wafer W to be lifted from the wafer holder 71 of the wafer transfer part 6 by being raised and lowered.

Such a substrate processing apparatus 9 performs light irradiation on the wafer W held in an arbitrary orientation by the wafer transfer part 6, and thereafter, changes the orientation of the wafer W relative to the wafer transfer part 6 by rotating the wafer transfer part 6 while the wafer W is lifted from the wafer transfer part 6 by the arm 94. After that, the substrate processing apparatus 9 again performs light irradiation on the wafer W held by the wafer transfer part 6. It is assumed the orientation of the wafer transfer part 6 is changed so that the wafer holder 71 holds the wafer W while being superimposed on the back surface of the wafer W at different positions during the first round of light irradiation and during the second round of light irradiation. Further, it is assumed that the arm 94 is retracted to the retracted position so as not to interfere the light irradiation during each light irradiation.

As in this substrate processing apparatus 9, the entire back surface of the wafer W may be irradiated with light without a relative movement between the light irradiation unit 3 and the wafer transfer part 6 in the transverse direction. However, the back surface of the wafer W is also irradiated with light even at a position thereof where the light shielding plate 66 is not provided below the wafer W (a position where the wafer holder 71 is provided). Therefore, in order to more reliably prevent the infiltration of light to the front side of the wafer W, as illustrated in FIG. 1 and the like, the window 32, that is, the light irradiation area, may be adapted to be superimposed on only a part of the wafer W in a plan view. Further, as exemplified by this substrate processing apparatus 9, changing the relative orientation between the wafer W and the wafer transfer part 6 in order to change the holding position of the wafer W is not limited to the rotation of the wafer W, but may be realized by the rotation of the wafer transfer part 6. In addition, in this substrate processing apparatus 9, the arm 94, the movement mechanism 93, and the rotation mechanism 92 correspond to a stage, a relative lifting mechanism, and a relative rotation mechanism, respectively.

Figure 25:
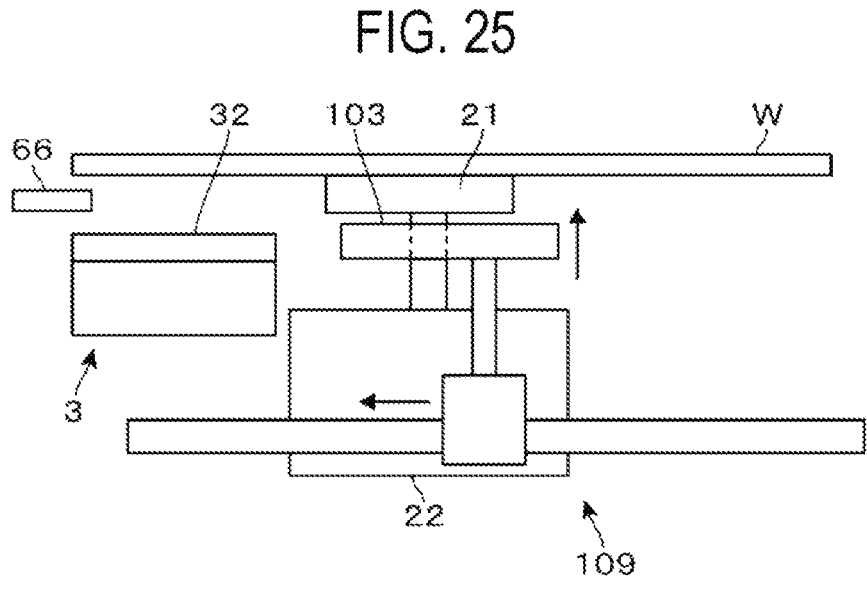
FIG. 25 is a side view illustrating a modification of the substrate processing apparatus.
Figure 26:
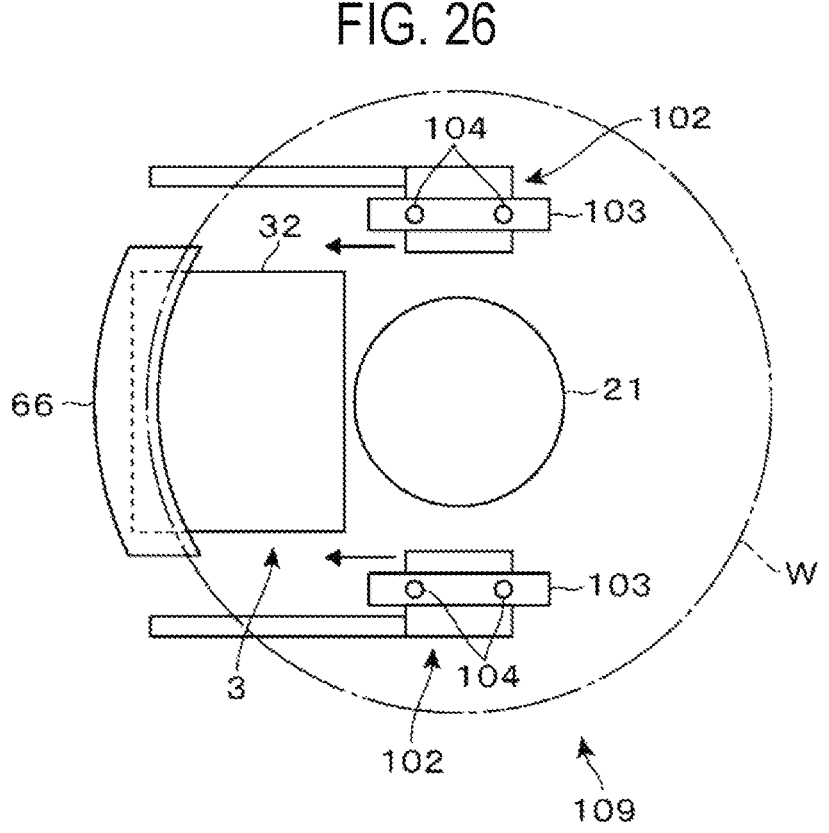
FIG. 26 is a side view illustrating a modification of the substrate processing apparatus.

In a substrate processing apparatus 109 illustrated in FIGS. 25 and 26, the light irradiation unit 3 is provided below a peripheral edge portion of the wafer W, a central portion of which is attracted to and held by the spin chuck 21, and the light shielding plate 66 is provided on the light irradiation unit 3 so that the inner peripheral edge thereof follows the circumferential end of the wafer W, similarly to the light shielding plate 66 of the substrate processing apparatus 1. However, in this example, only one light shielding plate 66 is provided so as to shield light at a site of the circumferential end of the wafer W located above the light irradiation unit 3.

The substrate processing apparatus 109 includes a chuck 103 which is configured to be horizontally and vertically movable by a movement mechanism 102 and is capable of attracting and holding the back surface of the wafer W. The chuck 103 may hold a region of the back surface of the wafer W outside the region held by the spin chuck 21 by means of suction from a suction hole 104. The wafer W may be transferred between the spin chuck 21 and the chuck 103. During rotation of the spin chuck 21, light irradiation is performed and the organic film M is removed from a peripheral edge portion of the back surface of the wafer W. After that, the wafer W is transferred to the chuck 103 and is positioned such that a central portion of the back surface thereof is located on the light irradiation unit 3. Then, the central portion (that is, the region that was covered by the spin chuck 21) is irradiated with light, and the organic film M is removed therefrom. In this way, the organic film M is removed from the entire back surface of the wafer W.

In the substrate processing apparatus 109, the spin chuck 21 and the chuck 103 correspond to a substrate holder, and the movement mechanism 102 corresponds to a holding position changing mechanism. Further, as exemplified by this substrate processing apparatus 109, when the entire back surface of the wafer W is irradiated with light a plurality of times, the region of the wafer W irradiated with light for each time is not limited to the thick band-shaped region as illustrated in FIGS. 19 to 22, and how to set the region to be irradiated with light for each time is arbitrary. In addition, the substrate processing apparatus may be configured to perform light irradiation three or more times in order to irradiate the entire back surface of the wafer W with light.

The organic substance on the back surface of the wafer W to be removed is not limited to being a film made of HMDS, but may be, for example, a fluororesin film or the like. Furthermore, the organic substance is not limited to being formed as a film. For example, the organic substance may be scattered as impurities on the back surface of the wafer W, and the present technique may be used for the purpose of removing the impurities and cleaning the back surface of the wafer W. In addition, the purge gas discharged from each part of the substrate processing apparatus 1 is not limited to the $N_2$ gas, and for example, may be other types of inert gas such as argon gas. Furthermore, the substrate to be processed is not limited to the wafer W as a circular substrate but may be a rectangular substrate. In that case, the inner edge of the light shielding plate 66 may be linearly formed along the side of the substrate.

Second Embodiment

Figure 28:
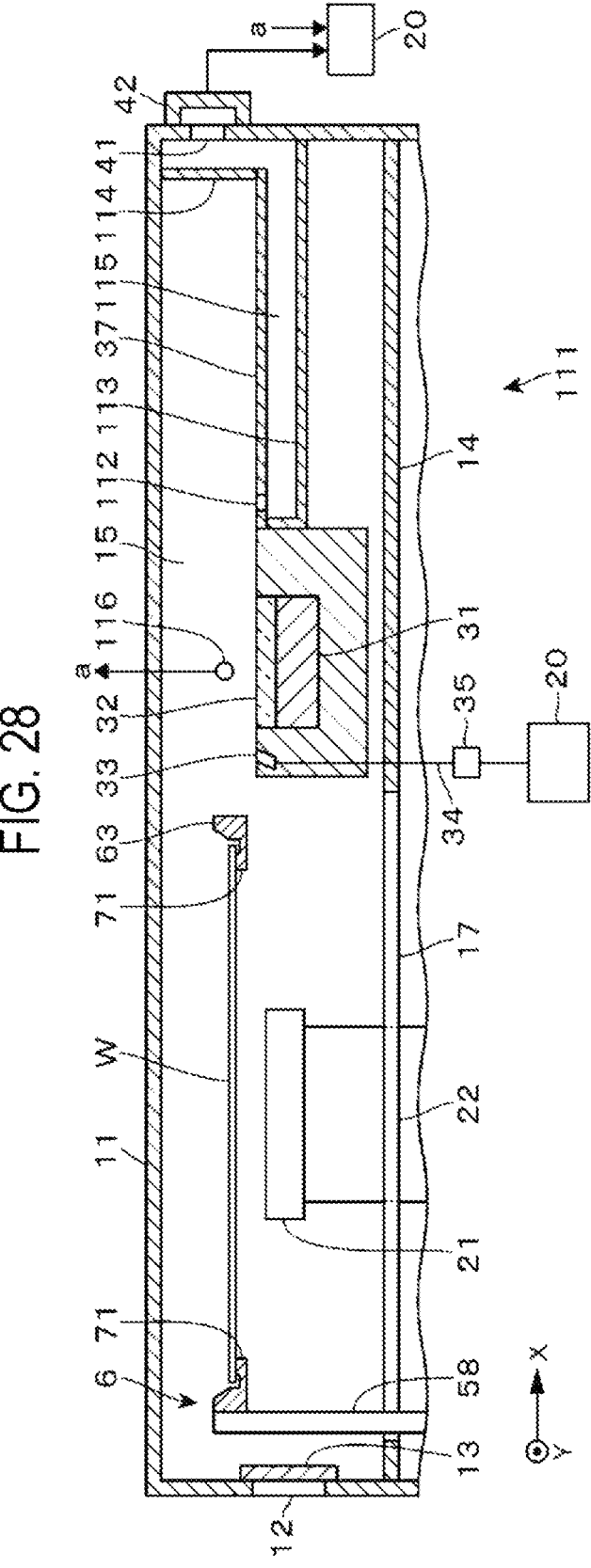
FIG. 28 is a longitudinal side view of a substrate processing apparatus according to a second embodiment of the present disclosure.
Figure 29:
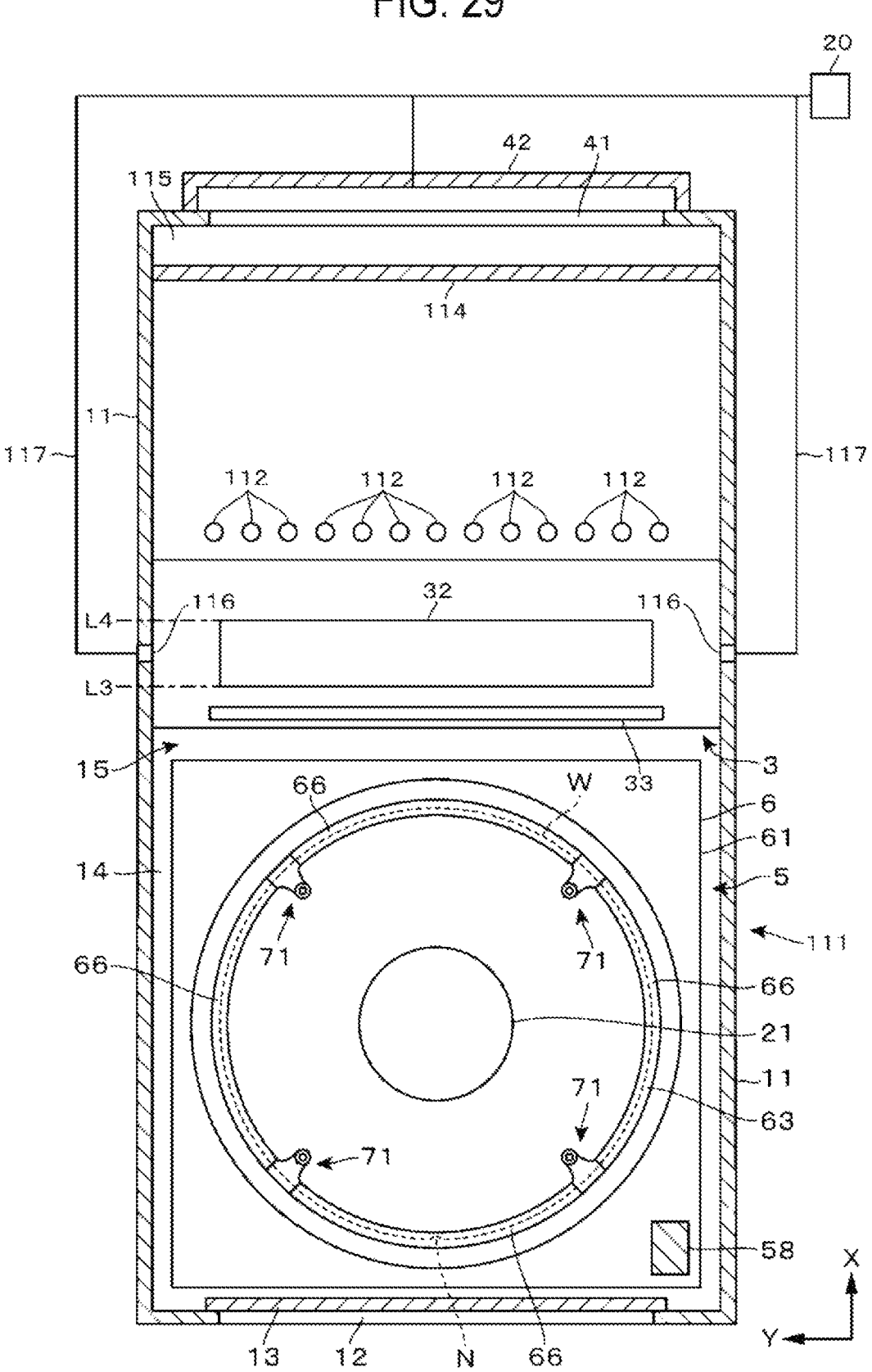
FIG. 29 is a cross-sectional plan view of the substrate processing apparatus.

Hereinafter, a substrate processing apparatus 111 according to a second embodiment will be described with reference to a longitudinal side view of FIG. 28 and a cross-sectional plan view of FIG. 29, focusing on differences from the substrate processing apparatus 1 of the first embodiment. In the following description, the X direction may be referred to as the front-rear direction, the side at which the transfer port 12 of the housing 11 is provided may be referred to as the front side, and the inner side of the housing 11 may be referred to as the rear side. Further, the words "left" and "right" are sometimes used, which are the left and the right when viewed from the rear to the front. In the substrate processing apparatus 111, with regard to active oxygen, such as ozone generated on the back side (lower surface side) of the wafer W by light irradiation, an exhaust path of the upper space 15 on the partition plate 14 within the housing 11 is modified compared to the substrate processing apparatus 1 so as to more reliably prevent the infiltration of the active oxygen to the front side (upper surface side) of the wafer W.

A plurality of through-holes drilled in the thickness direction of the plate 37 are provided in a row in the front end of the horizontal plate 37, which is disposed at the rear side of the light irradiation unit 3, and are spaced apart from each other in the Y direction (the left-right direction). Each of the through-holes formed so as to be opened upward in this manner is configured as an exhaust port 112 and suctions a gas vertically downward. Since the window 32 constituting a light irradiator extends in the left-right direction in the light irradiation unit 3, the row of exhaust ports 112 serving as first exhaust ports are arranged along the longitudinal direction of the window 32. Thus, assuming the plurality of exhaust ports 112 as one integrated exhaust port, the exhaust port is formed along the longitudinal direction of the window 32.

When the exhaust port 112 is formed in the plate 37, the exhaust port 112 is located below a movement path in the front-rear direction of the holding ring 63, which holds the wafer W, together with the gas outlet 33 and the window 32, which constitute a second purge gas discharge part. Then, the gas outlet 33, the window 32, and the exhaust port 112 are arranged in this order at intervals from the front side to the rear side.

A horizontal plate-shaped flow-path forming member 113, which extends from the light irradiation unit 3 to the inner sidewall (inner wall) of the housing 11, is provided below the plate 37 so as to be slightly spaced apart from the plate 37. Further, the rear end of the plate 37 is located at the front side of the inner sidewall (inner wall) of the housing 11, and an upright plate-shaped flow-path forming member 114 is provided so as to vertically extend from the rear end of the plate 37 to the upper wall of the housing 11. A gap between the plate 37 and the flow-path forming member 113 and a gap between the flow-path forming member 114 and the inner wall of the housing 11 are connected to each other and are configured as an L-shaped exhaust path 115 in a side view.

The exhaust path 115 is surrounded by the respective flow-path forming members 113 and 114 and the wall of the housing 11, thereby being partitioned from the surrounding area in the upper space 15. By exhaust from the exhaust port 41 in the inner wall of the housing 11, exhaust from the exhaust port 112 through the exhaust path 115 is triggered. In this way, in the substrate processing apparatus 111, the exhaust port 112 is open to the upper space 15 instead of the exhaust port 41 to realize exhaust. Hereinafter, the exhaust port 112 may be referred to as a lower exhaust port 112 in order to distinguish it from other exhaust ports.

By performing exhaust from the lower exhaust port 112 as well as the discharge of the purge gas from the gas outlet 33, an airflow flowing rearward on the window 32 is created for the implementation of the processing, similarly to the substrate processing apparatus 1 of the first embodiment. This airflow is indicated by arrows in longitudinal side views of FIGS. 30 and 31. In addition, the length of the row of the exhaust ports 112 in the Y direction is greater than the diameter of the wafer W and the length of the window 32 in the Y direction. Then, with regard to this row of the exhaust ports 112, the left end thereof is located leftward than the left end of the wafer W, which is moved while being held by the holding ring 63, and the left end of the window 32, and the right end thereof is located rightward than the right end of the wafer W, which moved while being held by the holding ring 63, and the right end of the window 32. Accordingly, the airflow is created so as to cover the diameter of the wafer W and the entire top of the window 32.

The airflow (exhaust airflow) created as described above owing to the lower exhaust port 112 located below the movement region of the holding ring 63 pushes out active oxygen such as ozone generated by light irradiation on the window 32, thereby preventing the infiltration of active oxygen to the upper surface of the wafer W. Further, since the lower exhaust port 112 is open to perform exhaust downward in addition to setting a positional relationship with the holding ring 63 and the wafer W as described above, the upward force of the purge gas discharged from the gas outlet 33 is reduced, and therefore, the infiltration of active oxygen to the surface of the wafer W is further prevented.

In addition, by forming the window 32 and the exhaust port 112 so as to extend in the left-right direction, respectively, as described above, each part of the window 32 formed so as to allow the entire diameter of the wafer W to be irradiated with light is prevented from having a relatively long distance to the exhaust port 112. Therefore, active oxygen generated on the window 32 is rapidly introduced into and removed through the exhaust port, and thus, the infiltration of active oxygen to the front side of the wafer W is more reliably prevented.

Figure 32:
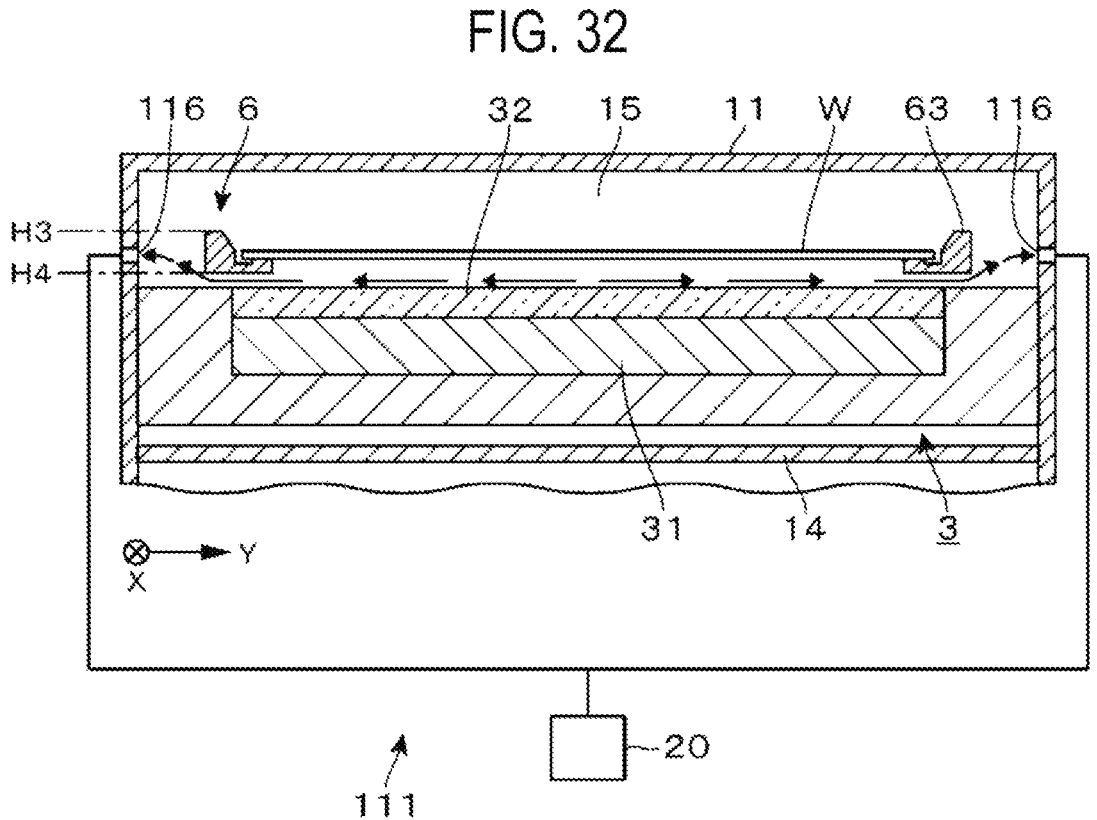
FIG. 32 is a longitudinal rear view of the substrate processing apparatus according to the second embodiment.

Further, a lateral exhaust port 116, which is a second exhaust port, is opened in each of the left and right sidewalls of the housing 11, and the lateral exhaust port 116 is connected to the exhaust source 20 through a pipe 117. Referring to FIG. 32 illustrating a longitudinal rear view of the substrate processing apparatus 111, the lateral exhaust port 116 serves to discharge active oxygen generated by light irradiation, thereby more reliably preventing the infiltration of active oxygen to the upper surface of the wafer W.

Assuming that the window 32 is extended leftward and rightward along the longitudinal direction thereof in a plan view for the purpose of preventing the infiltration of active oxygen, the lateral exhaust port 116 is formed so as to be opened to each extended region. Specifically, referring to FIG. 29 illustrating a plan view, the front end position and the rear end position of the leftward extended region of the window 32 are indicated by L3 and L4, respectively. As illustrated, the lateral exhaust port 116 at the left side is provided so as to be opened to the region from the front end position L3 to the rear end position L4. Although the rightward extended region of the window 32 is not illustrated, the lateral exhaust port 116 at the right side is also open to this extended region, similarly to the lateral exhaust port 116 at the left side.

When the lateral exhaust port 116, which is provided locally at each of the left and right sides of the window 32 as described above, is open to above the holding ring 63 located around the wafer W to surround the wafer W, there is a risk of active oxygen flowing upward of the holding ring 63 and coming into contact with the front surface of the wafer W. Further, when the lateral exhaust port 116 is open to below the holding ring 63, the lateral exhaust port 116 suctions a relatively large amount of the purge gas flowing from the gas outlet 33 to the lower exhaust port 112, thereby having a risk of deteriorating the removal of active oxygen by the purge gas. Therefore, the lateral exhaust port 116 may be disposed, for example, so as to be in a height region from the upper end height H3 to the lower end height H4 of the holding ring 63 surrounding the wafer W as illustrated in FIG. 32. Specifically, the upper end of the lateral exhaust port 116 is located at a height equal to or lower than the height H3, and the lower end of the lateral exhaust port 116 is located at a height equal to or higher than the height H4. The example illustrated in FIG. 32 illustrates that the upper end of the lateral exhaust port 116 is located lower than the height H3, and the lower end of the lateral exhaust port 116 is located higher than the height H4.

Figure 30:
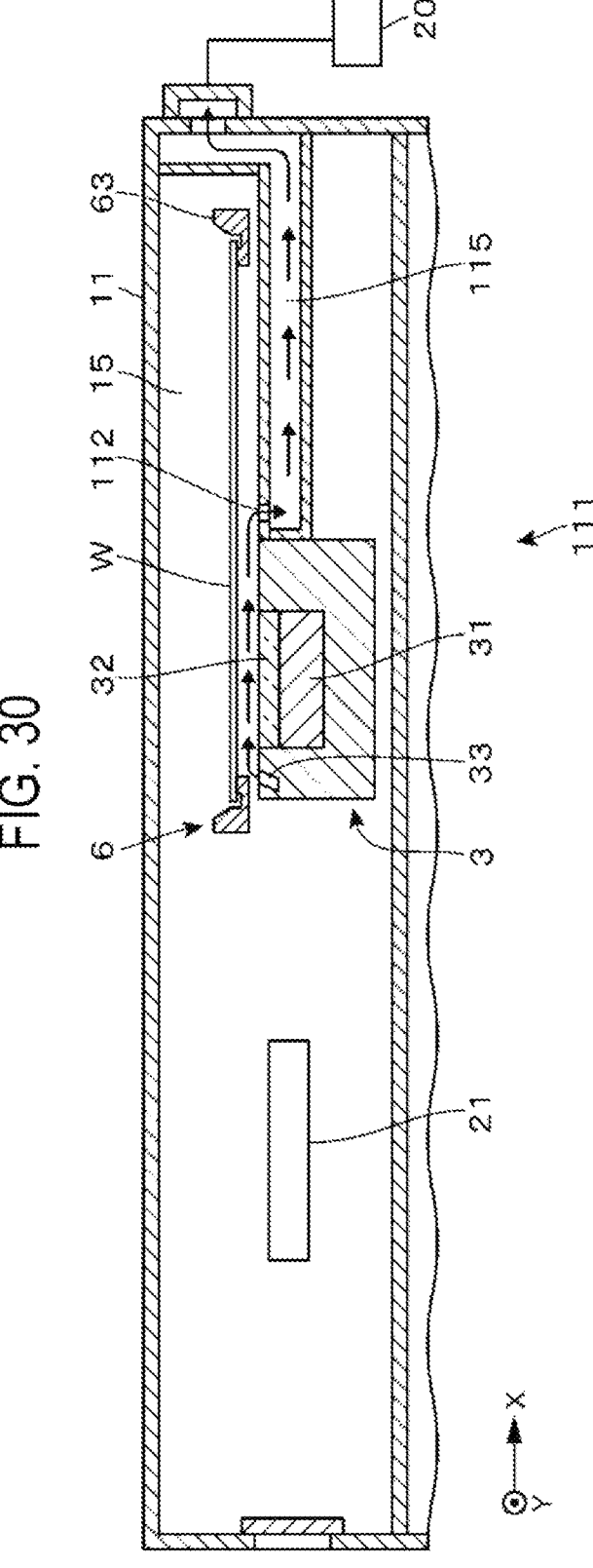
FIG. 30 is a longitudinal side view illustrating a processing mode in the substrate processing apparatus according to the second embodiment.

A processing of the wafer W in the substrate processing apparatus 111 will be described with reference to FIGS. 30 and 31, focusing on differences from the substrate processing apparatus 1 of the first embodiment. First, the holding ring 63 holding the wafer W is moved inward to the light irradiation start position within the housing 11. In a state where the purge gas is discharged from the gas outlet 33 of the light irradiation unit 3 and the gas outlet 87 of the holding ring 63 and exhaust is performed from the lower exhaust port 112 and the lateral exhaust port 116, a first round of light irradiation is started from the ultraviolet lamp 31 and the holding ring 63 begins to move forward (FIG. 30).

Figure 31:
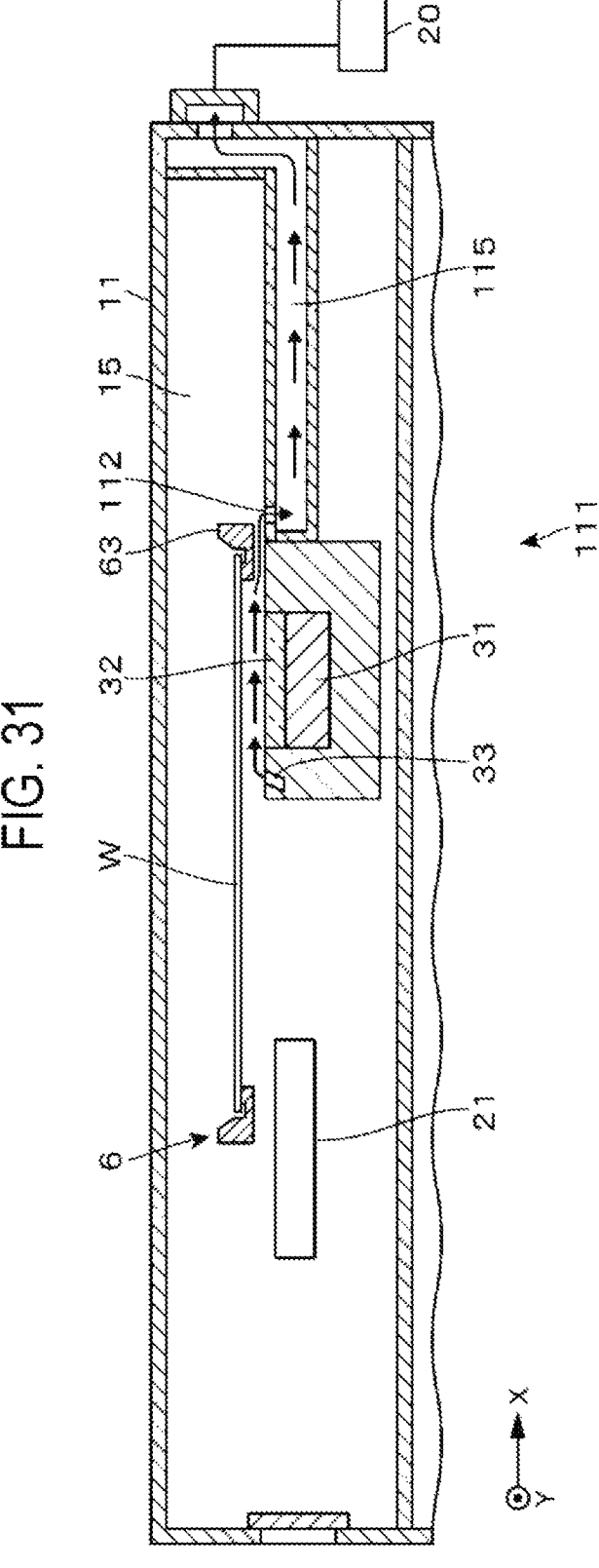
FIG. 31 is a longitudinal side view illustrating a processing mode in the substrate processing apparatus according to the second embodiment.

Then, when the holding ring 63 reaches the light irradiation end position, the first round of light irradiation ends (FIG. 31). After that, similarly to the first embodiment, the orientation of the wafer W held by the holding ring 63 is changed by 90 degrees by the spin chuck 21, and thereafter, the holding ring 63 is again moved to the light irradiation position. Then, the second round of light irradiation is started, and the holding ring 63 is moved toward the light irradiation end position. Once the holding ring 63 reaches the light irradiation end position, light irradiation is stopped.

FIGS. 31 and 32 illustrate the holding ring 63 at the light irradiation start position and at the light irradiation end position. As illustrated in FIGS. 31 and 32, a state where the wafer W is located above the lower exhaust port 112 is maintained until the holding ring 63 is completely moved from the light irradiation position to the light irradiation end position. That is, a state where the wafer W is superimposed on the lower exhaust port 112 in a plan view continues, and the wafer W is continuously irradiated with light during this state. Therefore, when the purge gas discharged from the gas outlet 33 flows to the lower exhaust port 112 during light irradiation, the flow direction is regulated by the lower surface of the wafer W, which makes it difficult for the purge gas to flow upward of the wafer W. Accordingly, the infiltration of active oxygen upward of the wafer W is more reliably prevented.

In addition, since the wafer W has a circular shape, some of the lower exhaust ports 112, which are located at the left and right ends of the row, are not superimposed on the wafer W while the holding ring 63 is moved from the light irradiation start position to the light irradiation end position. That a state where the lower exhaust ports 112 are superimposed on the wafer W in plan view is maintained as mentioned here means a state where at least some of the lower exhaust ports 112 are superimposed on the wafer W is maintained.

Further in this example, also with regard to the gas outlet 33, a state where the wafer W is superimposed on at least a part of the gas outlet 33 in a plan view is maintained until the holding ring 63 is moved from the light irradiation start position to the light irradiation end position. This is desirable because the flow direction of the purge gas is more reliably regulated by the wafer W as described above.

Figure 33:
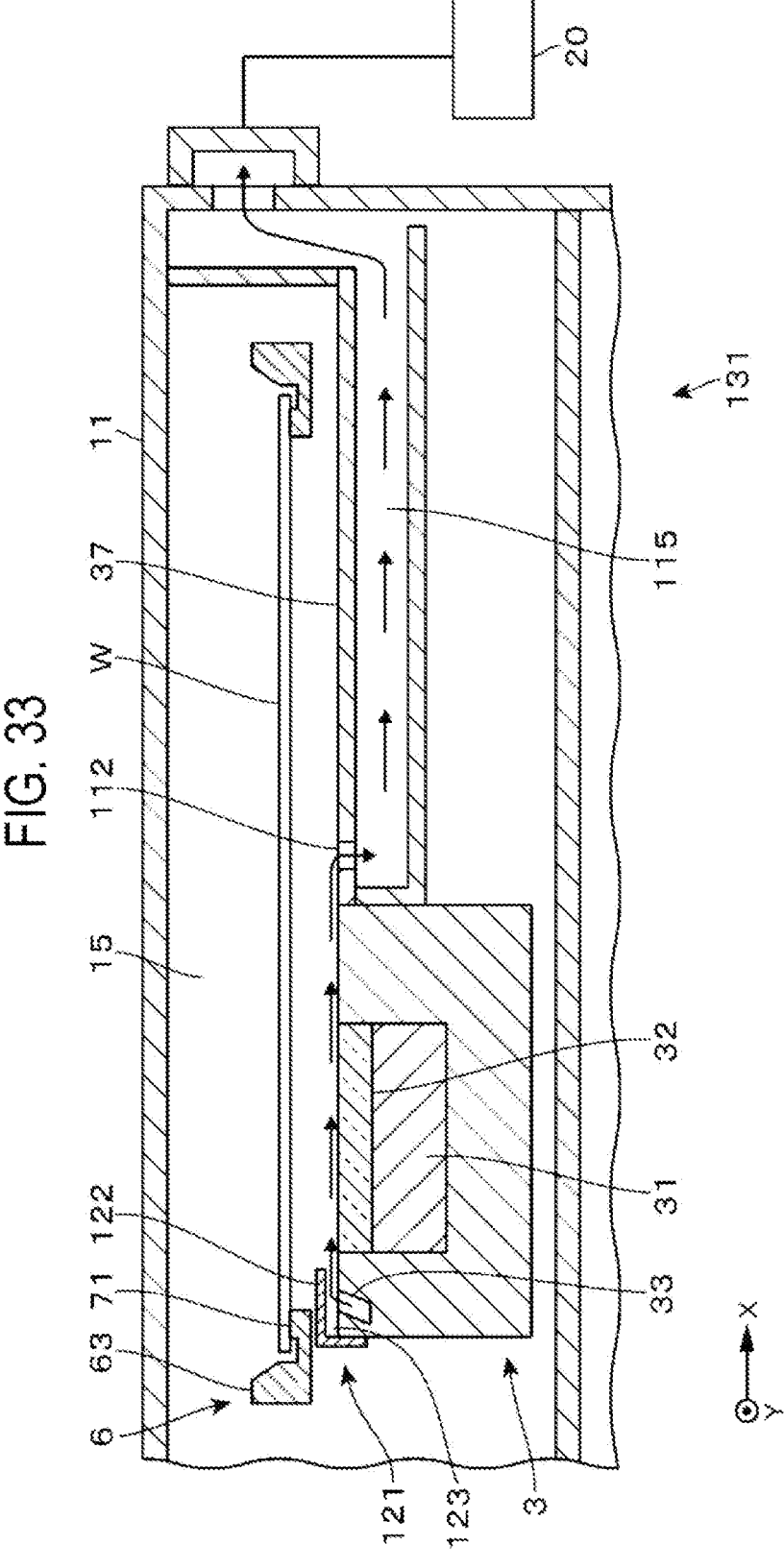
FIG. 33 is a longitudinal side view illustrating a modification of the second embodiment.

Hereinafter, modifications of the substrate processing apparatus 111 will be described, focusing on differences from the substrate processing apparatus 111. FIG. 33 is a longitudinal side view illustrating a substrate processing apparatus 131 according to a first modification. In the substrate processing apparatus 131, a plate-shaped cover forming member 121, which extends vertically upward, is provided on a wall portion at the front side of the light irradiation unit 3, and the upper side of the cover forming member 121 is bent rearward to form a horizontal cover 122. The cover 122 is provided to face the horizontal upper surface of the light irradiation unit 3 with a gap 123 interposed therebetween, and the purge gas discharged from the gas outlet 33 collides with the horizontal lower surface of the cover 122 and then flows rearward.

Hence, the position of the cover 122 will be described in detail. The cover 122 is located on an upwardly oblique extension line, which is the direction in which the gas outlet 33 is open, and the gap 123 is configured as a flow path of the purge gas in the horizontal direction to cause the purge gas flowing horizontally through the gap 123 to flow rearward. Accordingly, a purge gas discharge part constituted by the cover 122 and the gas outlet 33 is configured to discharge the gas in the horizontal direction. The purge gas discharged horizontally in this manner is difficult to be directed upward of the wafer W. Therefore, the infiltration of active oxygen to the upper surface of the wafer W is more reliably prevented.

Figure 34:
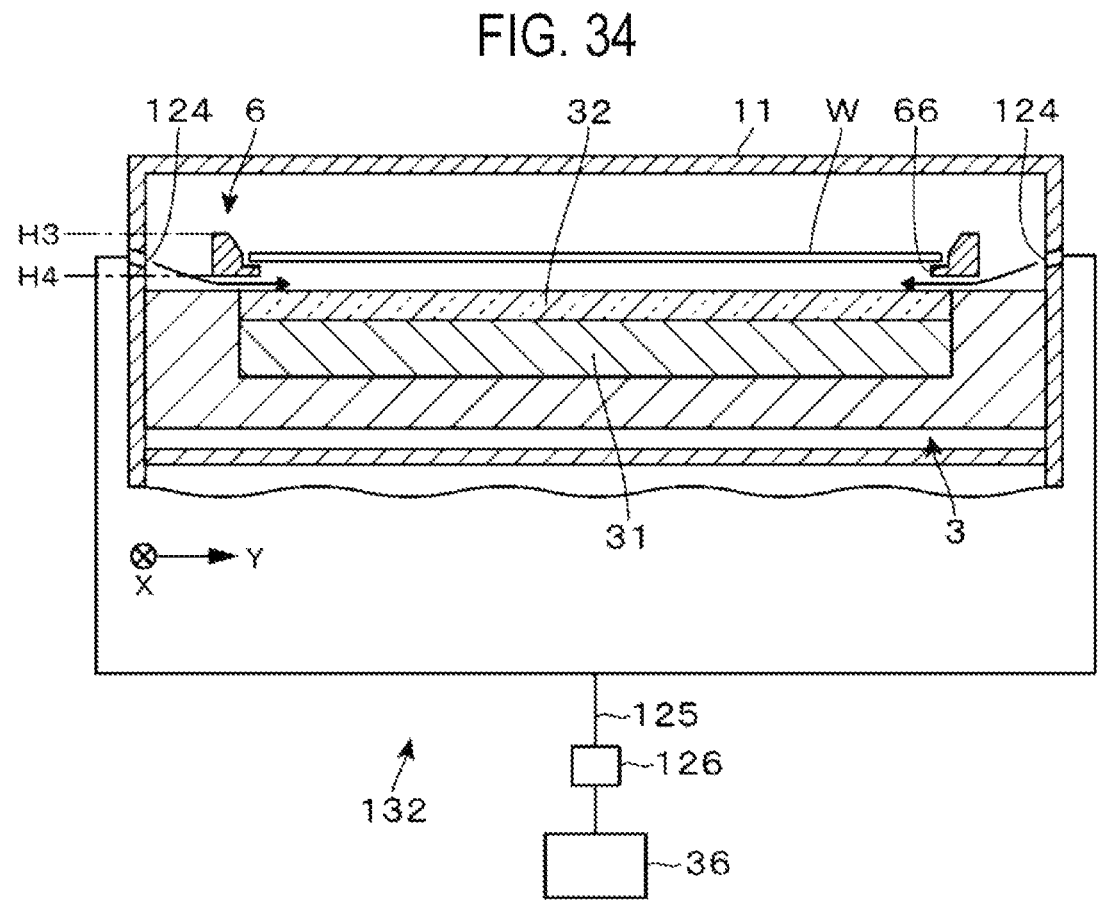

FIG. 34 is a longitudinal rear view illustrating a substrate processing apparatus 132 according to a second modification. The substrate processing apparatus 132 is provided on each of the left and right sidewalls of the housing 11 with a purge gas outlet 124 at the position where the lateral exhaust port 116 is provided in FIG. 32. However, the purge gas outlet 124 is open obliquely downward so as to discharge the N$_2$ gas as the purge gas onto the window 32. In order to distinguish the purge gas outlet 124 from each purge gas outlet described so far, it will hereinafter be referred to as the lateral purge gas outlet 124. The lateral purge gas outlet 124 is connected to a source 36 of the N$_2$ gas through a pipe 125, and a valve 126 is interposed in the pipe 125.

While the purge gas is discharged from the gas outlet 33 of the light irradiation unit 3 and the gas outlet 87 of the holding ring 63, the valve 126 is open, causing the purge gas to be discharged from the lateral purge gas outlet 124. Thus, specifically, while the holding ring 63 described with reference to FIGS. 31 and 32 is moved from the light irradiation start position to the light irradiation end position and light irradiation is performed, the purge gas is discharged from the lateral purge gas outlet 124.

The purge gas discharged from the lateral purge gas outlet 124, which forms a third purge gas discharge part, is discharged between the window 32 and movement paths before and after the holding ring 63 holding the wafer W, and is introduced into and removed through the lower exhaust port 112 together with the purge gas discharged from the gas outlet 33 of the light irradiation unit 3. The purge gas from this lateral purge gas outlet 124 serves not only to purge the generated active oxygen to the lower exhaust port 112 to thereby prevent the infiltration of active oxygen to the front surface of the wafer W, but also to reduce the concentration of active oxygen or the atmosphere on the window 32 to thereby prevent irradiation light from the window 32 from being absorbed by the active oxygen or the atmosphere. As will be described later with regard to evaluation tests, by preventing the absorption of irradiation light, the influence of the light shielding plate 66 provided along the peripheral edge of the wafer W may be reduced, which may enable the removal of a film from the entire back surface of the wafer W even if the energy of irradiation light from the window 32 is relatively small.

The position of the lateral purge gas outlet 124 will be described in detail. As described above, since the lateral purge gas outlet 124 is used to purge the active oxygen generated on the window 32, a positional relationship between the purge gas outlet 124 and the window 32 in the X direction (the front-rear direction) is the same as a positional relationship between the lateral exhaust port 116 and the window 32 in the X direction in a plan view as described with reference to FIG. 29.

Further, the upper end of the lateral purge gas outlet 124 may be located, for example, at a height equal to the upper end of the lateral exhaust port 116 or at a height equal to or lower than the upper end height H3 of the holding ring 63, in order to prevent the active oxygen infiltrated upward of the wafer W from being supplied to the front surface of the wafer W. Additionally, the lower end of the lateral purge gas outlet 124 may be located below the lower end height H4 of the holding ring 63 since it is enough to supply the purge gas below the wafer W. In addition, to ensure that the lateral purge gas outlet 124 is open to below the holding ring 63, the lateral purge gas outlet 124 may be opened to the horizontal direction and is not limited to being formed so as to discharge the purge gas obliquely as illustrated. Since it may be sufficient for the lateral purge gas outlet 124 to supply the purge gas between the wafer W and the window 32, the lateral purge gas outlet 124 is not limited to being provided on both left and right sidewalls of the housing 11 but may be provided on one sidewall.

Figure 35:
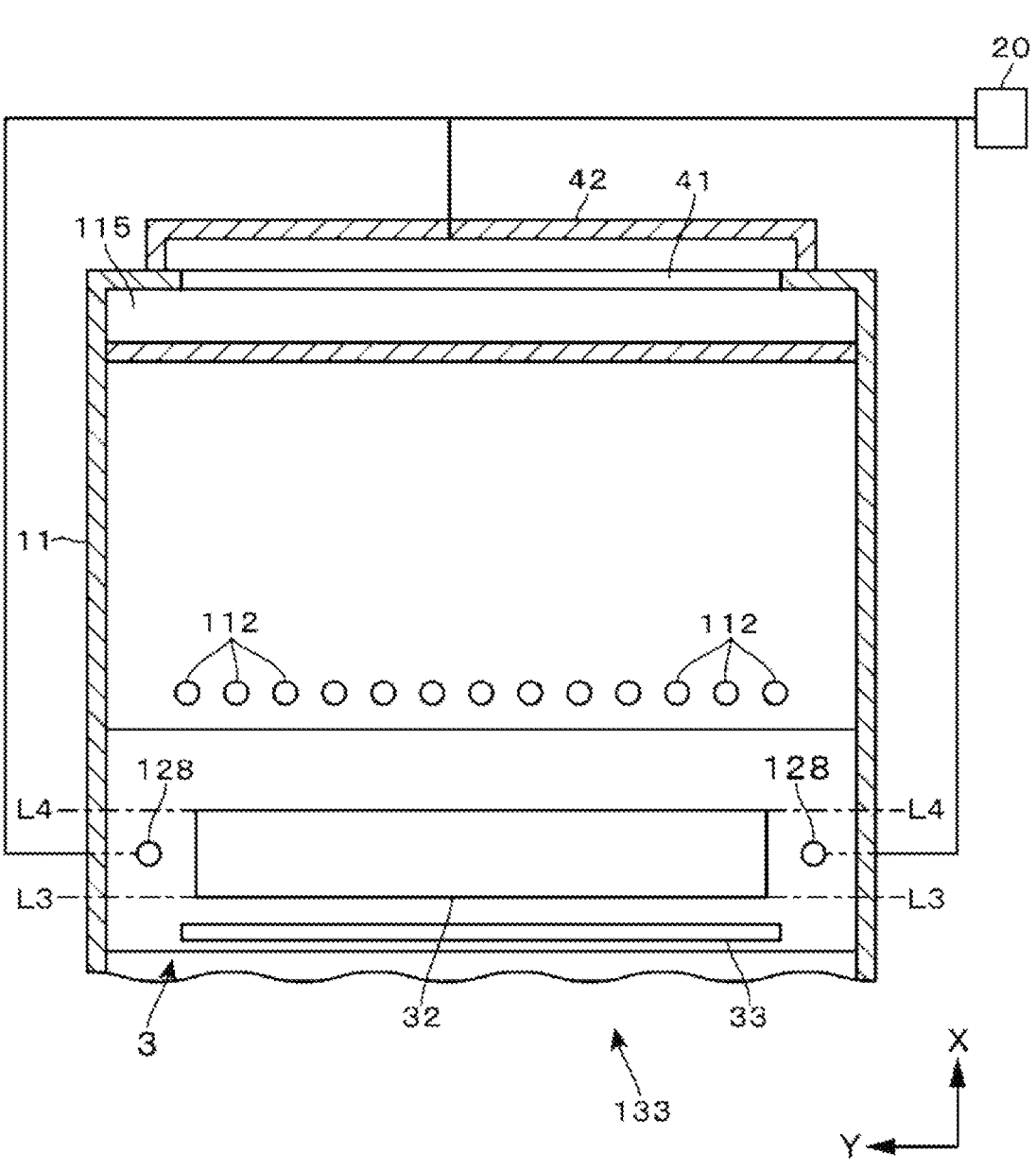
FIG. 35 is a plan view illustrating a modification of the second embodiment.

FIG. 35 illustrates a plan view of a substrate processing apparatus 133 according to a third modification. In the substrate processing apparatus 133, instead of providing the lateral exhaust port 116 on the sidewall of the housing 11, an exhaust port 128 is opened in each of leftward and rightward extended regions of the window 32 on the upper surface of the light irradiation unit 3. This exhaust port 128 prevents the infiltration of active oxygen generated on the window 32 by light irradiation to the front surface of the wafer W, in the same manner as the lateral exhaust port 116 described with reference to FIG. 29 and the like.

An exhaust port provided locally at the left and right sides of the window 32 is not limited to being provided on the sidewall of the housing 11 as exemplified by the lateral exhaust port 116 but may be open to a region from the front end position L3 to the rear end position L4 of each of the leftward and rightward extended regions of the window 32 in a plan view. However, in order to prevent a large amount of purge gas from the gas outlet 33 from being suctioned to the exhaust port as described above, the exhaust ports provided at the left and right sides of the window 32 may be open to the height described above as the height at which the lateral exhaust port 116 is provided.

The substrate processing apparatus 111 of the second embodiment and components of the modifications thereof described above with reference to FIGS. 28 to 35 may be appropriately combined. Further, in the respective examples of FIGS. 28 to 35, exhaust or the discharge of the purge gas is performed from the lateral side of the window 32 but may not be performed laterally. That is, in the upper space 15 within the housing 11, the purge gas may be discharged only from the gas outlet 33 and the gas outlet 87 of the holding ring 63, and exhaust may be performed only from the exhaust port 112. In addition, only one of the lateral purge gas outlet 124 and the lateral exhaust port 116 may be provided in order to prevent the infiltration of active oxygen to the front surface of the wafer W due to the disturbed flow of gas when gas discharge and exhaust occur at a close range. However, it is not prohibited to provide both the lateral purge gas outlet 124 and the lateral exhaust port 116.

The shape and number of the lower exhaust port 112, the lateral exhaust port 116, the lateral purge gas outlet 124, and the exhaust port 128 described in the second embodiment are arbitrary, and are not limited to the examples described above. For example, the lower exhaust port 112 may be opened in the form of a slit extending along the Y direction, similarly to the gas outlet 33.

Further, the embodiments disclosed herein should be considered to be exemplary and not limitative in all respects. The above embodiments may be omitted, replaced, modified and combined in various ways without departing from the scope and spirit of the appended claims.

[Evaluation Test]

Evaluation Test 1

Evaluation tests performed in relation to the present technique will be described. In evaluation test 1, an HMDS film was formed from a peripheral edge portion of the front surface to a peripheral edge portion of the back surface by way of the side surface of the wafer W. Then, the state of the remaining HMDS film was observed by irradiating the back surface of the wafer W with light using a test apparatus which is substantially the same as the substrate processing apparatus 1. To explain the above light irradiation more specifically, it was performed by arranging a unit, which emits light upward similarly to the light irradiation unit 3, so that a light irradiation area of the unit is superimposed on a peripheral edge portion of the wafer W in a plan view. Further, when performing this light irradiation, the holding ring 63 described in the embodiments was disposed at the lateral side of the wafer W, and the distance between the holding ring 63 and the side surface of the wafer W was adjusted to change the lateral distance L1 for the light shielding plate 66 described with reference to FIG. 6.

Figure 27:
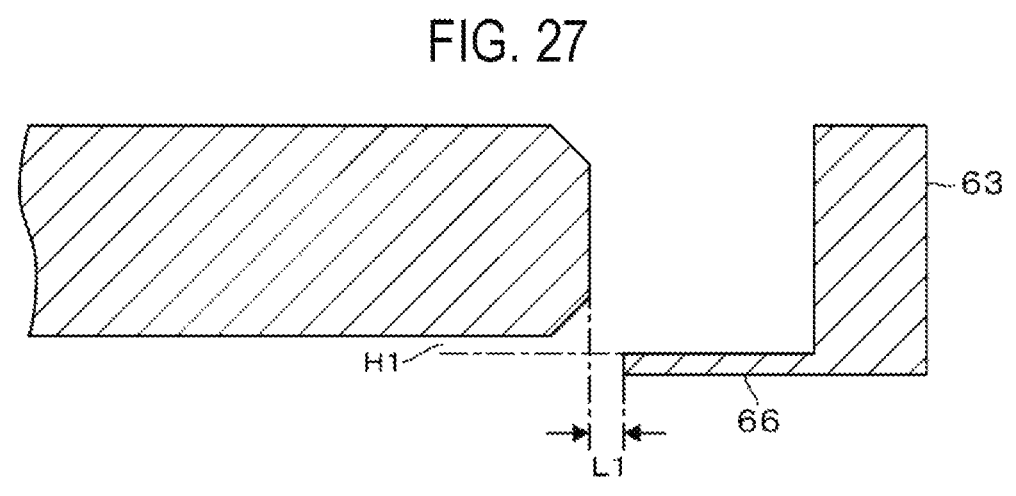

In evaluation test 1-1, the lateral distance L1 was set to 1.0 mm. Thus, the tip end of the light shielding plate 66 is superimposed on the peripheral edge portion of the back surface of the wafer Win evaluation test 1-1. In evaluation test 1-2, the lateral distance L1 was set to 0.0 mm. That is, the circumferential end of the wafer W and the inner peripheral edge of the light shielding plate 66 are superimposed with each other in a plan view in evaluation test 1-2. In addition, a state where only the edges of the wafer W and the light shielding plate 66 are superimposed with each other as in evaluation test 1-2 is also assumed to a state where the wafer W and the light shielding plate 66 are superimposed with each other in a plan view. In evaluation test 1-3, the lateral distance L1 was set to −0.6 mm. As described above, since the lateral distance L1 is a distance that the inner peripheral edge of the light shielding plate 66 extends toward the center of the circular region 64 on the basis of the circumferential end of the wafer W, the light shielding plate 66 and the wafer W are not superimposed with each other and are spaced apart from each other in a plan view when the lateral distance L1 has a negative value as described above. FIG. 27 is a side view illustrating a positional relationship between the light shielding plate 66 and the wafer W in evaluation test 1-3. In evaluation tests 1-1 to 1-3, the height distance H1 between the light shielding plate 66 and the wafer W was set to 0.5 mm.

Further, in addition to evaluation tests 1-1 to 1-3, evaluation test 1-4 was performed. In evaluation test 1-4, the holding ring 63 was disposed as in evaluation test 1-1, but the light shielding plate 66 was not provided on the holding ring 63. In addition, in these evaluation tests 1-1 to 1-4, the purge gas was not discharged from the holding ring 63.

In evaluation test 1-4, the HMDS film was removed from the side surface of the wafer W and from the circumferential end to a position relatively close to the central portion of the front surface of the wafer W, in addition to the peripheral edge portion of the back surface of the wafer W. That is, the amount of infiltration of light and the $O_3$ gas was large. Further, in evaluation test 1-1, the HMDS film on the side surface of the wafer W and the front surface of the wafer W was not removed. However, on the back surface of the wafer W, the HMDS film was removed in a region thereof that was not superimposed on the light shielding plate 66, but remained in a region thereof that was superimposed on the light shielding plate 66.

In evaluation tests 1-2 and 1-3, the HMDS film was removed from the entire region of the peripheral edge portion of the wafer W superimposed on the light irradiation area. Then, the HMDS film was also removed from the side surface of the wafer W. However, on the front surface of the wafer W, the HMDS film was removed only from the inclined surface at the front side. More specifically, in evaluation test 1-2, the HMDS film was removed in the region from the circumferential end to a position centrally spaced apart therefrom by 0.31 mm on the front surface of the wafer W, and in evaluation test 1-3, the HMDS film was removed in the region from the circumferential end to a position centrally spaced apart therefrom by 0.33 mm on the front surface of the wafer W. That is, the desirable result of preventing the infiltration of light and the $O_3$ gas to the front side of the wafer W was obtained.

Evaluation Test 2

In evaluation test 2, a test substantially similar to evaluation test 1 was performed. This evaluation test 2 may have a difference in that the lateral distance L1 was set to 1.0 mm and the wafer W was irradiated with light while changing the height distance H1. In evaluation tests 2-1, 2-2, and 2-3, H1 was set to 0.5 mm, 1.5 mm, and 2.95 mm, respectively.

In evaluation test 2-1, the HMDS film on the side surface of the wafer W and the front surface of the wafer W was not removed. However, the HMDS film remained in the region of the back surface of the wafer W superimposed on the light shielding plate 66. In evaluation test 2-2, the HMDS film was removed from the back surface of the wafer W in a wider range than in evaluation test 2-1, but remained from the region on the back side slightly closer to the center than the inclined surface to the front side by way of the side surface. That is, the removal of the film on the back surface was insufficient, although the film was removed from the back surface of the wafer W in a wider range than in evaluation test 2-1. In evaluation test 2-3, the film was removed from the entire back surface of the wafer W, and the HMDS film remained on the side surface and the front surface of the wafer W. Accordingly, the desirable result of preventing the infiltration of light and the $O_3$ gas to the front side of the wafer W was obtained.

It was confirmed from evaluation tests 1 and 2 described above that the infiltration of light and the $O_3$ gas to the front side of the wafer W may be effectively prevented in some cases in both situations when the tip end of the light shielding plate 66 is superimposed on the wafer W in a plan view and when they are spaced apart from each other in a plan view. Further, it was confirmed in evaluation test 1 that the infiltration of light and the $O_3$ gas to the front surface may be effectively prevented in some cases when the height distance H1 was set to 0.5 mm and it was confirmed in evaluation test 2 that the infiltration of light and the $O_3$ gas to the front surface may be effectively prevented in some cases when the height distance H1 was set to 2.95 mm. Then, since the range within which the film was removed was expanded in evaluation test 2-3 in which the height distance H1 was set to 2.95 mm, compared to evaluation test 2-2 in which the height distance H1 was smaller than in evaluation test 2-3, but the HMDS film remained not only on the front surface but also on the side surface, it is contemplated that the infiltration of light and the $O_3$ gas to the front side may be effectively prevented even if the height distance H1 is slightly greater than 2.95 mm. Therefore, it is contemplated that the height distance H1 is preferably set to, for example, 0.5 mm to 3.0 mm.

Evaluation Test 3

In evaluation test 3, after forming a resist film by sequentially applying and heating a resist to the front surface of the wafer W, the film thickness of the resist film was measured in each in-plane portion of the wafer W (first film thickness measurement). After that, the back surface of the wafer W was irradiated with light as described in the embodiments and was further developed, and then, the film thickness of the resist film was again measured in each in-plane portion of the wafer W (second film thickness measurement). Then, the difference value of the film thicknesses in each in-plane portion of the wafer W (film thickness of first measurement– film thickness of second measurement) was calculated from the result of each film thickness measurement.

The light irradiation to the back surface of the wafer W was performed in the substrate processing apparatus 1 of the first embodiment or in the substrate processing apparatus 111 of the second embodiment. A test performed using the substrate processing apparatus 1 is evaluation test 3-1, and a test performed using the substrate processing apparatus 111 is evaluation test 3-2. However, the substrate processing apparatus 111 used in this evaluation test 3 differs from that described with reference to FIG. 28 in that exhaust from the lateral side of the window 32 is not performed because the lateral exhaust port 116 is not provided. In addition, in this evaluation test 3, regarding the substrate processing apparatuses 1 and 111, the amount of exposure on the back surface of the wafer W was set to 300 $mJ/cm^2$, the amount of purge gas ($N_2$ gas) discharged from the gas outlet 33 was set to 15 L/min, and the amount of exhaust from the exhaust port 41 of the inner wall of the housing 11 or the lower exhaust port 112 was set to 130 L/min.

The test results will be described. Regarding the difference value of the film thickness measured in evaluation test 3-1, when it is assumed that the average value is A1, the range (maximum value–minimum value) is B1, and 3σ is C1, the average value was 0.11×A1, the range was 0.56×B1, and 3σ was 0.45×C1 for the difference value of the film thickness measured in evaluation test 3-2. Accordingly, the obtained result was that the difference value of the film thickness in evaluation test 3-2 has higher uniformity than that in evaluation test 3-1. When the infiltration of active oxygen to the front surface of the wafer W occurs, the surface of the resist film deteriorates, and a reduction in the film thickness due to developing increases. Therefore, the high uniformity of the difference value of the film thickness prevents local deterioration in the plane of the wafer W due to the infiltration of active oxygen to the front surface of the wafer W.

Further, in a detailed description of the test results, four regions in the circumferential end of the wafer W, which differ from each other by 90 degrees when viewed from the center of the wafer W, will be described as circumferential end regions R1, R2, R3, and R4 in order along the circumference of the wafer W. Considering the distribution of the difference value of the film thickness in the plane of the wafer W described above, the difference value of the film thickness was slightly larger in the circumferential end regions R1 to R4 than in the regions in the plane of the wafer W. The difference value of the film thickness in these four circumferential end regions R1 to R4 in evaluation test 3-2 was smaller than that in evaluation test 3-1.

Accordingly, it was confirmed in evaluation test 3-1 that active oxygen infiltrated slightly to the circumferential end of the front surface of the wafer W from the left and right sides during the first and second rounds of light irradiation for the wafer W, whereas it was confirmed in evaluation test 3-2 that this infiltration was prevented. Accordingly, it was found from this evaluation test 3 that the infiltration of active oxygen to the front surface of the wafer W may be more reliably prevented by forming the lower exhaust port 112 to perform exhaust as described in the embodiments.

Evaluation Test 4

In evaluation test 4, the wafer W was processed and the film thickness was measured twice as in evaluation test 3. The substrate processing apparatus 111 was used to irradiate the back surface of the wafer W with light. However, the substrate processing apparatus 111 used in this evaluation test 4 differs from that illustrated in FIG. 29 in that the lateral exhaust port 116 is provided only on the left sidewall among the left and right sidewalls of the housing 11. The processing was performed by changing the amount of exhaust from the lateral exhaust port 116 for each wafer W. Tests performed by setting the amount of exhaust from the lateral exhaust port 116 to 5 L/min, 10 L/min, and 20 L/min, respectively, are evaluation tests 4-2, 4-3, and 4-4, respectively. Further, for comparison, a test was performed under the same conditions as in evaluation tests 4-2 to 4-4 except that the substrate processing apparatus 111 without the lateral exhaust port 116 used in evaluation test 3 was used, and this test is evaluation test 4-1. The substrate processing apparatus 111 used in evaluation test 4 performed the processing by individually setting the amount of exposure on the back surface of the wafer W to 300 mJ/cm², the amount of the purge gas discharged from the gas outlet 33 to 15 L/min, and the amount of exhaust from the lower exhaust port 112 to 70 L/min.

The result of this evaluation test 4 will be described. The difference value of the film thickness (film thickness of first measurement−film thickness of second measurement) in R1 and R2 of the circumferential end regions R1 to R4 was smaller in evaluation tests 4-2 to 4-4 than in evaluation test 4-1. The circumferential end regions R1 and R2 are leftward regions to which the lateral exhaust port 116 is open during the first round or second round of light irradiation. Accordingly, the result was that the infiltration of active oxygen to the front side was prevented on the side of the circumferential end of the wafer W facing the lateral exhaust port 116 during each of the first and second rounds of light irradiation.

Regarding the difference value of the film thickness in evaluation test 4-1, when it is assumed that the average value is A2, the range is B2, and $3\sigma$ is C2, the average value was $0.5 \times A2$, the range was B2, and $3\sigma$ was $1.14 \times C2$ for the difference value of the film thickness in evaluation test 4-2. Regarding the film thickness measured in evaluation test 4-3, the average value was $0.5 \times A2$, the range was $1.11 \times B2$, and $3\sigma$ was $1.14 \times C2$. As for the film thickness measured in evaluation test 4-4, the average value was $0.25 \times A2$, the range was B2, and $3\sigma$ was $1.10 \times C2$. Accordingly, the average value of the difference value of the film thickness could be reduced in evaluation tests 4-2 to 4-4 compared to that in evaluation test 4-1, and could be reduced the most in evaluation test 4-4. In addition, the range and $3\sigma$ do not change significantly between evaluation test 4-1 and evaluation tests 4-2 to 4-4 because of the residual influence of a location where the lateral exhaust port is not open. As described above, it was found from evaluation test 4 that the infiltration of active oxygen to the front surface of the circumferential end of the wafer W may be more reliably prevented by further performing exhaust through the lateral exhaust port 116 as described in the embodiments when performing the processing by exhaust through the lower exhaust port 112.

Evaluation Test 5

In evaluation test 5, the wafer W was processed and the film thickness was measured twice as in evaluation test 4. In this evaluation test 5, the substrate processing apparatus 131 provided with the cover forming member 121 which covers the gas outlet 33 as described with reference to FIG. 33 was used. However, this substrate processing apparatus 131 is not provided with the lateral exhaust port 116, similarly to the substrate processing apparatus 111 used in evaluation test 4-1. The amount of exposure to the back surface of the wafer W, the amount of the purge gas discharged from the gas outlet 33, and the amount of exhaust from the lower exhaust port 112 were set similarly to evaluation test 4. Accordingly, in this evaluation test 5, the processing was performed under the same conditions as in evaluation test 4-1 except that the cover forming member 121 is provided in the substrate processing apparatus 111.

When representing the difference value of the film thickness obtained in evaluation test 5 using the average value=A2, the range=B2, and $3\sigma$=C2 in evaluation test 4-1, the average value was $0.125 \times A2$, and the maximum value–minimum value was $0.76 \times B2$, and $3\sigma$ was $0.62 \times C2$. Further, considering the distribution of the difference values of the film thicknesses within the plane of the wafer W, it was confirmed that each value in the peripheral edge regions R1 to R4 in evaluation test 5 is smaller than that in evaluation test 4-1, and the infiltration of active oxygen to the surface of the circumferential end of the wafer W was prevented compared to evaluation test 4-1. Accordingly, it was confirmed from this evaluation test 5 that it is effective to horizontally discharge the purge gas upon exhaust through the lower exhaust port 112 as described in the embodiments in order to prevent the infiltration of active oxygen.

Evaluation Test 6

In evaluation test 6, the wafer W was processed and the film thickness was measured twice as in evaluation test 4. In this evaluation test 6, the substrate processing apparatus 132 in which the housing 11 is provided with the lateral purge gas outlet 124 as described with reference to FIG. 34 was used. However, this lateral purge gas outlet 124 is different from that illustrated in FIG. 34 in that it is provided only on the left sidewall among the left and right sidewalls of the housing 11. In addition, the amount of exposure on the back surface of the wafer W, the amount of the purge gas discharged from the gas outlet 33, and the amount of exhaust from the lower exhaust port 112 were set similarly to evaluation test 4. Accordingly, in this evaluation test 6, the processing was performed under the same conditions as in evaluation test 4-1 except that the purge gas is discharged from the lateral purge gas outlet 124. The amount of the purge gas discharged was set to 15 L/min.

When representing the difference value of the film thickness obtained in evaluation test 6 using the average value=A2, the range=B2, and 3σ=C2 in evaluation test 4-1, the average value was 0.63×A2, and the maximum value–minimum value was 0.65×B2, and 3σ was 0.71×C2. Further, considering the distribution of the difference values of the film thicknesses within the plane of the wafer W, it was confirmed that each value in the peripheral edge regions R1 to R4 in evaluation test 6 is smaller than that in evaluation test 4-1, and the infiltration of active oxygen to the surface of the circumferential end of the wafer W was prevented. Accordingly, it was confirmed from this evaluation test 6 that it is effective to discharge the purge gas from the lateral purge gas outlet 124 upon exhaust through the lower exhaust port 112 in order to prevent the infiltration of active oxygen.

Evaluation Test 7

In evaluation tests 7-1 and 7-2, the same apparatus as that used in evaluation test 4-1 and the same apparatus as that used in evaluation test 6 were respectively used to irradiate the back surface of the wafer W with light. The film described in the embodiments was formed on the back surface of each wafer W before light irradiation, and the state of the film after light irradiation was observed. The exposure amount in each apparatus was set to 80 mJ/cm$^2$, which is smaller than those in evaluation test 4-1 and evaluation test 6.

In evaluation test 7-1, the annular film with a width of 2.0 mm remained in the circumferential end of the wafer W. In evaluation test 7-2, the annular film with a width of 0.5 mm remained in the circumferential end of the wafer W. Since the light shielding plate 66 is disposed below the wafer W, the film remains when the amount of exposure is too low. The area of the remaining film is small in evaluation test 7-2. Accordingly, it was confirmed that the irradiation light from the window 32 is attenuated by the supply of the purge gas from the lateral purge gas outlet 124 as described in the embodiments. From this result, it can be seen that the amount of irradiation light required to remove the film from the entire back surface of the wafer W may be reduced by discharging the purge gas from the lateral purge gas outlet 124.

According to the present disclosure in some embodiments, it is possible to perform light irradiation so that an organic substance is removed from the entire back surface of a substrate without any unnecessary processing on the front side of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:

a substrate holder configured to hold a substrate while being locally superimposed on a back surface of the substrate;

a light irradiator configured to irradiate the back surface with light so as to remove an organic substance on the back surface of the substrate;

a light shielding member provided at a back side of the substrate while being spaced apart from the back surface so as to prevent the light from being supplied to a front surface of the substrate; and a holding position changing mechanism configured to change a holding position by the substrate holder on the back surface of the substrate so as to irradiate the entire back surface of the substrate with the light.

2. The substrate processing apparatus of claim 1, further comprising: an enclosure provided to surround a side circumference of the substrate, wherein the light shielding member is provided on the enclosure.

3. The substrate processing apparatus of claim 2, wherein the light shielding member is formed as a plate-shaped body that extends from an inner peripheral surface of the enclosure toward the back side of the substrate held by the substrate holder, the plate-shaped body having a tip formed along a circumferential end of the substrate.

4. The substrate processing apparatus of claim 1, further comprising: a first purge gas discharge part configured to discharge a purge gas to a gap between the substrate held by the substrate holder and the light shielding member from above the gap.

5. The substrate processing apparatus of claim 4, further comprising: an enclosure provided to surround a side circumference of the substrate, wherein the first purge gas discharge part corresponds to the enclosure and includes a first purge gas outlet formed along a circumferential end of the substrate and configured to discharge the purge gas to the gap from an outer periphery toward an inner periphery of the substrate.

6. The substrate processing apparatus of claim 1, wherein the holding position changing mechanism includes:

a stage on which the substrate is placed;

a relative lifting mechanism configured to raise and lower the substrate holder relative to the stage so as to transfer the substrate between the stage and the substrate holder; and a relative rotation mechanism configured to rotate the stage relative to the substrate holder so as to change a position of the substrate holder on the back surface of the substrate.

7. The substrate processing apparatus of claim 6, further comprising: a relative transverse movement mechanism configured to move the substrate holder and the light shielding member in a transverse direction relative to the light irradiator, wherein the relative transverse movement mechanism moves the substrate holder and the light shielding member in the transverse direction relative to the light irradiator configured to irradiate the back surface with the light while holding a first position on the back surface of the substrate, and subsequently, moves the substrate holder and the light shielding member in the transverse direction relative to the light irradiator configured to irradiate the back surface with light while holding a second position, which is different from the first position, on the back surface of the substrate via the stage.

8. The substrate processing apparatus of claim 7, further comprising: an enclosure provided to surround a side circumference of the substrate,
   wherein the substrate holder and the light shielding member are provided on the enclosure,
   wherein the relative transverse movement mechanism moves the enclosure in the transverse direction,
   wherein the relative rotation mechanism rotates the stage,
   wherein the substrate processing apparatus further comprises a housing configured to accommodate the enclosure, the light irradiator, the holding position changing mechanism, and the relative transverse movement mechanism, and
   wherein the substrate is transferred between the stage and a substrate transfer mechanism provided outside the housing.

9. The substrate processing apparatus of claim 8, further comprising: a second purge gas discharge part configured to discharge a purge gas so as to be directed laterally between the light irradiator and the back surface of the substrate.

10. The substrate processing apparatus of claim 9, further comprising: a first exhaust port provided to be open upward to exhaust an interior of the housing,
   wherein the light irradiator and the first exhaust port are provided to extend in a left-right direction below a movement path of the enclosure that moves in a forward direction and in a backward direction inside the housing.

11. The substrate processing apparatus of claim 10, wherein the second purge gas discharge part, the light irradiator, and the first exhaust port are provided side by side in order from the forward direction to the backward direction, and
   wherein the purge gas flows from the second purge gas discharge part toward the first exhaust port.

12. The substrate processing apparatus of claim 11, wherein a state where the substrate is located above the first exhaust port is maintained while the substrate is irradiated with the light from the light irradiator.

13. The substrate processing apparatus of claim 11, wherein the second purge gas discharge part horizontally discharges the purge gas in the backward direction.

14. The substrate processing apparatus of claim 11, further comprising: a second exhaust port configured to exhaust the interior of the housing and opened in a region extending in each of a leftward direction and a rightward direction along a longitudinal direction of the light irradiator in a plan view.

15. The substrate processing apparatus of claim 14, wherein the second exhaust port is provided on a sidewall of the housing.

16. The substrate processing apparatus of claim 15, wherein the second exhaust port is in a height region from an upper end to a lower end of the enclosure.

17. The substrate processing apparatus of claim 11, further comprising: a third purge gas discharge part provided on a sidewall of the housing and configured to discharge the purge gas between the light irradiator and the movement path of the enclosure.

18. The substrate processing apparatus of claim 1, wherein the substrate holder includes an attractor configured to attract the substrate.

19. A substrate processing method comprising:
   holding a substrate by a substrate holder locally superimposed on a back surface of the substrate;
   irradiating the back surface with light by a light irradiator so as to remove an organic substance on the back surface of the substrate;
   preventing the light from being supplied to a front surface of the substrate by a light shielding member provided at a back side of the substrate while being spaced apart from the back surface; and
   changing a holding position by the substrate holder on the back surface of the substrate by a holding position changing mechanism so as to irradiate the entire back surface of the substrate with the light.

20. A non-transitory computer-readable storage medium that stores a computer program used in a substrate processing apparatus that irradiates a back surface of a substrate with light,
   wherein the computer program incorporates a group of steps so as to execute the method of claim 19.

* * * * *